US012696758B2

(12) United States Patent
Lee et al.

(10) Patent No.: US 12,696,758 B2
(45) Date of Patent: Jul. 28, 2026

(54) SEMICONDUCTOR DEVICES AND METHODS OF FORMING THE SAME

(71) Applicant: GlobalFoundries Singapore Pte. Ltd., Singapore (SG)

(72) Inventors: Shu Hui Lee, Singapore (SG); Jianxun Sun, Singapore (SG); Juan Boon Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 382 days.

(21) Appl. No.: 18/479,107

(22) Filed: Oct. 1, 2023

(65) Prior Publication Data

US 2025/0112149 A1 Apr. 3, 2025

(51) Int. Cl.
| | |
|---|---|
| *H10W 20/49* | (2026.01) |
| *H10W 20/00* | (2026.01) |
| *H10W 20/41* | (2026.01) |
| *H10W 20/42* | (2026.01) |
| *H10W 20/46* | (2026.01) |

(52) U.S. Cl.
CPC ....... *H10W 20/491* (2026.01); *H10W 20/056* (2026.01); *H10W 20/064* (2026.01); *H10W 20/072* (2026.01); *H10W 20/076* (2026.01); *H10W 20/081* (2026.01); *H10W 20/42* (2026.01); *H10W 20/435* (2026.01); *H10W 20/46* (2026.01)

(58) Field of Classification Search
CPC .................................................. H10W 20/491
See application file for complete search history.

(56) References Cited

U.S. PATENT DOCUMENTS

| | | | | |
|---|---|---|---|---|
| 6,251,710 B1 * | 6/2001 | Radens | ............... | H10W 20/491 |
| | | | | 438/131 |
| 7,226,816 B2 * | 6/2007 | Bertin | ................. | H10W 20/491 |
| | | | | 257/E21.396 |
| 8,471,356 B2 * | 6/2013 | Cheng | ................. | H10W 20/491 |
| | | | | 438/467 |
| 8,736,020 B2 * | 5/2014 | Bao | ..................... | H10W 20/491 |
| | | | | 438/131 |
| 8,750,069 B2 * | 6/2014 | Kim | ....................... | G11C 17/14 |
| | | | | 365/225.7 |
| 10,418,277 B2 | 9/2019 | Cheng et al. | | |
| 10,453,793 B2 | 10/2019 | Bergendahl et al. | | |
| 11,024,577 B1 * | 6/2021 | Park | ................... | H10W 20/491 |
| 11,881,431 B2 * | 1/2024 | Park | ................... | H10W 20/074 |

(Continued)

OTHER PUBLICATIONS

U.S. Appl. No. 18/065,632, filed Jun. 20, 2024, Lee et al.

*Primary Examiner* — Evren Seven
(74) *Attorney, Agent, or Firm* — David Cain

(57) ABSTRACT

A device includes an antifuse structure. The antifuse structure includes a first contact structure and a second contact structure in a first interlevel dielectric (ILD) layer, an opening arranged between the first contact structure and the second contact structure in the first ILD layer, and a dielectric capping layer lining at least sidewalls of the opening. A second ILD layer is arranged over the first ILD layer and in the opening. The second ILD layer lines the dielectric capping layer on at least the sidewalls of the opening. A third contact structure is arranged between the first contact structure and the second contact structure. The third contact structure includes a first portion in the opening.

20 Claims, 18 Drawing Sheets

(56) References Cited

U.S. PATENT DOCUMENTS

| | | | |
|---|---|---|---|
| 12,327,759 B2 * | 6/2025 | Na | H10W 20/034 |
| 2007/0040276 A1 * | 2/2007 | Yang | H10W 20/491 |
| | | | 257/758 |
| 2008/0012138 A1 * | 1/2008 | Wang | H10W 20/491 |
| | | | 257/758 |
| 2008/0296728 A1 * | 12/2008 | Yang | H10W 20/493 |
| | | | 257/E21.585 |
| 2013/0299940 A1 | 11/2013 | Kurz et al. | |
| 2015/0236154 A1 * | 8/2015 | Park | H10D 64/513 |
| | | | 257/331 |
| 2018/0025980 A1 * | 1/2018 | Yang | H10W 20/491 |
| | | | 257/530 |
| 2021/0233843 A1 * | 7/2021 | Yang | H10W 20/491 |
| 2024/0014127 A1 * | 1/2024 | Li | H10W 20/491 |

* cited by examiner

101

100

100

500

600

601

600

SEMICONDUCTOR DEVICES AND METHODS OF FORMING THE SAME

TECHNICAL FIELD

The present disclosure relates generally to semiconductor devices, and more particularly to devices including an antifuse structure fuse structure, and methods of forming the same.

BACKGROUND

Fuses and antifuses are commonly used in electronic circuits to selectively enable or disable certain features or sections of the circuits. Fuses are designed to permanently break an electrically conductive path, for example, when the current through the path exceeds a predetermined limit, thus rerouting the electrical signal through another intended section of the circuitry. Antifuses, on the other hand, perform in an opposite manner compared to a fuse. Antifuses are designed to create a conductive path or link, for example, when a voltage across the antifuse exceeds a certain level. In semiconductor devices, antifuses for example may be useful for permanently programming selected integrated circuits. As semiconductor devices continue to shrink in size, the processing of antifuses and fuses becomes increasingly challenging as the spacing between features becomes smaller and more difficult to form. For example, in some cases, the length of the conductive path which can be formed in traditional antifuse structures is constrained by the minimum design rule spacing between metal to metal. Improved structures and methods of forming such structures are therefore required.

SUMMARY

Embodiments generally relate to semiconductor devices and methods of forming thereof. According to various embodiments, a device including an antifuse structure is provided. The antifuse structure may include a first contact structure and a second contact structure in a first interlevel dielectric (ILD) layer, an opening arranged between the first contact structure and the second contact structure in the first ILD layer, and a dielectric capping layer lining at least sidewalls of the opening. A second ILD layer may be arranged over the first ILD layer and in the opening. The second ILD layer may line the dielectric capping layer on at least the sidewalls of the opening. A third contact structure may be arranged between the first contact structure and the second contact structure. The third contact structure includes a first portion in the opening.

According to another aspect, a device including an antifuse structure is provided. The antifuse structure may include a first contact structure and a second contact structure in a first ILD layer, an opening arranged between the first contact structure and the second contact structure in the first ILD layer, and a dielectric capping layer lining at least sidewalls of the opening. A third contact structure may be arranged between the first contact structure and the second contact structure. The third contact structure includes a first portion in the opening. The antifuse structure further includes a conductive link extending between the first contact structure and the third contact structure and through the dielectric capping layer in the opening.

According to yet another aspect, a device may include a first contact structure and a second contact structure, and a third contact structure between the first contact structure and the second contact structure. The third contact structure may include a terminal electrode portion positioned between vias of the first and second contact structures in an ILD layer. The terminal electrode portion may be arranged in a recess of the ILD layer. A dielectric capping layer may line the recess in the ILD layer.

According to various embodiments, a method of forming a device is provided. The method may include providing a first contact structure and a second contact structure in a first ILD layer. An antifuse structure may be formed. In one aspect, an opening may be formed between the first contact structure and the second contact structure in the first ILD layer. A dielectric capping layer may be formed to line at least sidewalls of the opening. A second ILD layer may be formed over the first ILD layer and in the opening to line the dielectric capping layer on at least the sidewalls of the opening. A third contact structure may be formed between the first contact structure and the second contact structure. The third contact structure includes a first portion in the opening.

According to yet another aspect, a method of forming a device may include forming a first contact structure and a second contact, and a third contact structure between the first contact structure and the second contact structure. Forming the third contact structure may include forming a terminal electrode portion between vias of the first and second contact structures in an ILD layer. The terminal electrode portion may be formed in a recess of the ILD layer. A dielectric capping layer may be further formed to line the recess in the ILD layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Figure 1A:
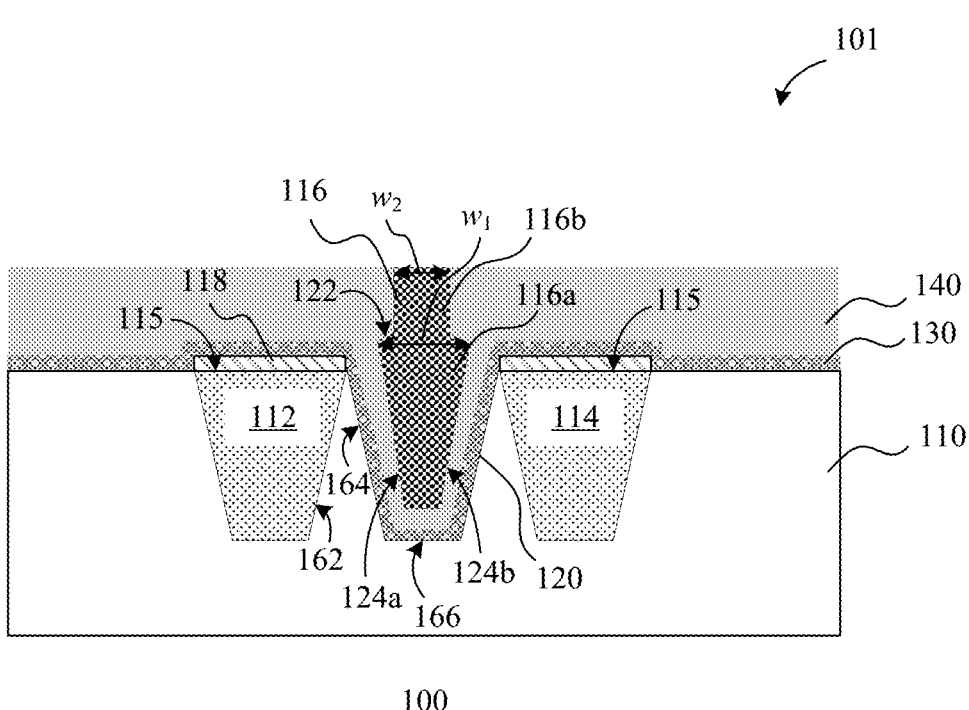
FIGS. 1A-1B illustrate cross-sectional views of an exemplary device, according to various embodiments.
Figure 1B:
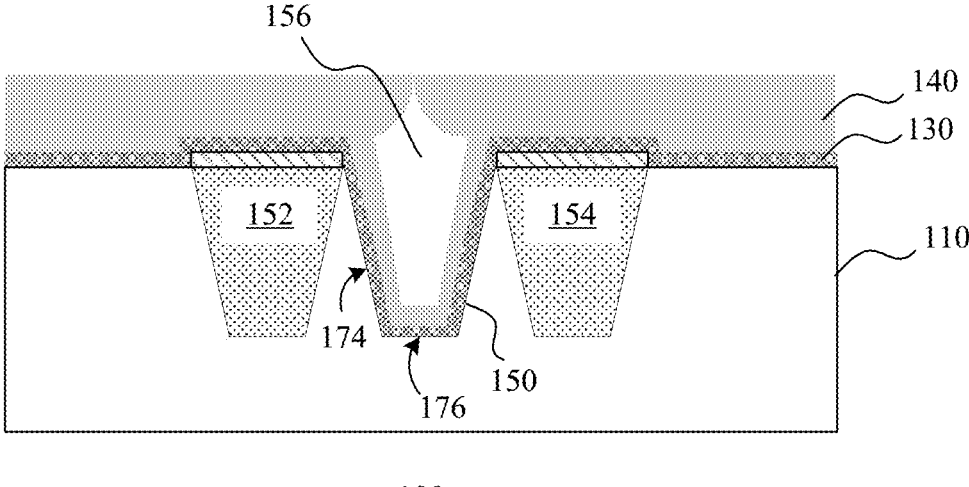

FIGS. 1A-1B illustrate cross-sectional views of an embodiment of a device 100. According to various embodiments, the device 100 includes an antifuse structure 101, as illustrated in FIG. 1A. The antifuse structure 101 may be arranged over a substrate, such as a semiconductor substrate or a silicon-on-insulator substrate (not shown). In some embodiments, the antifuse structure 101 may be arranged over one or more interlevel dielectric layers (ILDs) in the back-end-of-line (BEOL) layers of a semiconductor device.

The antifuse structure 101 may include a first contact structure 112 and a second contact structure 114 in a first ILD layer 110. A third contact structure 116 may be positioned between the first contact structure 112 and the second contact structure 114. For example, the third contact structure 116 may be a middle electrode positioned between the first contact structure 112 and the second contact structure 114, which may be side electrodes of the antifuse structure 101. The first contact structure 112, the second contact structure 114 and the third contact structure 116 may be laterally spaced from one another. The first contact structure 112, the second contact structure 114 and the third contact structure 116 may be formed of a conductive material such as copper, copper alloy, aluminum, tungsten or a combination thereof. Other suitable types of metal, alloys or conductive materials may also be useful. In some embodiments, the first contact structure 112, the second contact structure 114 and the third contact structure 116 may include a conductive barrier layer (not shown) lining sidewalls and a bottom surface of the respective first contact structure 112, the second contact structure 114 and the third contact structure 116. The conductive barrier layer, for example, may be formed of tantalum nitride or titanium nitride. The first ILD layer 110 may be formed of a dielectric material such as, for example, silicon oxide.

A metallic capping layer 118 may be arranged on the first contact structure 112 and the second structure 114. The metallic capping layer 118 may serve as a hard mask for forming an opening between the first contact structure 112 and the second structure 114. In some embodiments, the metallic capping layer 118 may be used to protect the first contact structure 112 and the second structure 114 during processing of the antifuse structure 101. For example, the metallic capping layer 118 may be formed of metal such as cobalt.

According to various embodiments, a first opening 120 may be arranged between the first contact structure 112 and the second contact structure 114 in the first ILD layer 110. A dielectric capping layer 130 may be arranged over the first ILD layer 110. According to various embodiments, the dielectric capping layer 130 may be arranged in the first opening 120 to line at least sidewalls 164 of the first opening 120. As illustrated in FIG. 1A, the dielectric capping layer 130 may be arranged in the first opening 120 to line the sidewalls 164 and a bottom surface 166 of the first opening 120. The dielectric capping layer 130 may be further arranged over the metallic capping layer 118. The dielectric capping layer 130 may serve as an etch stop layer. For example, the dielectric capping layer 130 may prevent an over etch of the dielectric capping layer in the first opening 120. According to various embodiments, the dielectric capping layer 130 may prevent the oxidation of the metallic capping layer 118, the first contact structure 112 and the second structure 114, for example, during deposition of a subsequent layer above the dielectric capping layer 130. The dielectric capping layer 130 may be formed of a different dielectric material from the first ILD layer 110. The dielectric capping layer 130 may be formed of a dielectric material such as a nitride-containing dielectric material. For example, the dielectric capping layer 130 may be formed of silicon nitride or NBlok. The dielectric capping layer 130, for example, may have a thickness ranging from about 20 nm to about 70 nm. The thickness of the dielectric capping layer 130 may depend on a thickness of the first contact structure 112 and the second structure 114.

A second ILD layer 140 may be arranged over the first ILD layer 110 and in the first opening 120 to line the dielectric capping layer 130 in the first opening 120. The second ILD layer 140 may line the dielectric capping layer 130 on at least the sidewalls 164 of the first opening 120. As illustrated in FIG. 1A, the second ILD layer 140 may line the dielectric capping layer 130 on the sidewalls 164 and on the bottom surface 166 of the first opening 120. In some embodiments, the second ILD layer 140 may continuously overlap (e.g., uninterrupted extension, unbroken) the dielectric capping layer 130 on the sidewalls 164 of the first opening 120. In other embodiments, depending on the etch and clean process, the second ILD layer 140 may not continuously overlap the dielectric capping layer 130 on the sidewalls 164 of the first opening 120. The second ILD layer 140 and the dielectric capping layer 130 in the first opening 120 may separate the third contact structure 116 from the first contact structure 112 and the second contact structure 114. The second ILD layer 140 may be formed of a different dielectric material from the dielectric capping layer 130. The dielectric capping layer 130 and the second ILD layer 140 may be formed of different materials having different etch rates. According to various embodiments, the second ILD layer 140 may have a higher etch rate relative to the dielectric capping layer 130. For example, the second ILD layer 140 may be formed of silicon oxide.

The third contact structure 116 may include a first portion 116a and a second portion 116b above the first portion 116a. The first portion 116a of the third contact structure 116 may be laterally arranged between the first contact structure 112 and the second contact structure 114. The first portion 116a may fill the first opening 120. In some embodiments, the first portion 116a may completely fill the space in the first opening 120, without leaving an air gap in the first opening 120. A top surface 122 of the first portion 116a of the third contact structure 116 may be higher than or above a top surface 115 of the first contact structure 112 and/or the second contact structure 114. The second portion 116*b* may have a width $w_2$ less than a largest width $w_1$ of the first portion 116*a*. For example, the largest width $w_1$ of the first portion 116*a* may be along the top surface 122 of the first portion 116*a*.

According to various embodiments, a portion of the first ILD layer 110 may fill a space between immediately adjacent sidewalls 162 and 164 of the first contact structure 112 and the first opening 120. As illustrated in FIG. 1A, the immediately adjacent sidewalls 162 and 164 of the first contact structure 112 and the first opening 120 may be spaced from each other at a first end and converge at an opposing second end. For example, the immediately adjacent sidewalls 162 and 164 of the first contact structure 112 and the first opening 120 form a V-shape configuration. Similarly, a portion of the first ILD layer 110 may fill a space between immediately adjacent sidewalls of the second contact structure 114 and the first opening 120. The immediately adjacent sidewalls of the second contact structure 114 and the first opening 120 may be spaced from each other at a first end and converge at an opposing second end. For example, the immediately adjacent sidewalls of the second contact structure 114 and the first opening 120 form a V-shape configuration.

In an embodiment, a portion of the first ILD layer 110, the dielectric capping layer 130 and the second ILD layer 140 may form a stacked interlayer dielectric portion between the first contact structure 112 and the third contact structure 116. Similarly, a portion of the first ILD layer 110, the dielectric capping layer 130 and the second ILD layer 140 may form a stacked interlayer dielectric portion between the second contact structure 114 and the third contact structure 116. In some embodiments, the stacked interlayer dielectric portion may be an oxide-nitride-oxide stack.

The device 100 may further include a second opening 150 arranged between a fourth contact structure 152 and a fifth contact structure 154 in the first ILD layer 110. The dielectric capping layer 130 may further line sidewalls 174 and a bottom surface 176 of the second opening 150, as illustrated in FIG. 1B. The second ILD layer 140 may line the dielectric capping layer 130 in the second opening 150 and enclose an air gap 156 in the second opening 150. For example, a thickness of the second ILD layer 140 pinches off above a space separating the fourth contact structure 152 and the fifth contact structure 154 to enclose the air gap 156. As illustrated in FIG. 1B, the second ILD layer 140 may continuously overlap the dielectric capping layer 130 on the sidewalls 174 and on the bottom surface 176 of the second opening 150.

Figure 2:
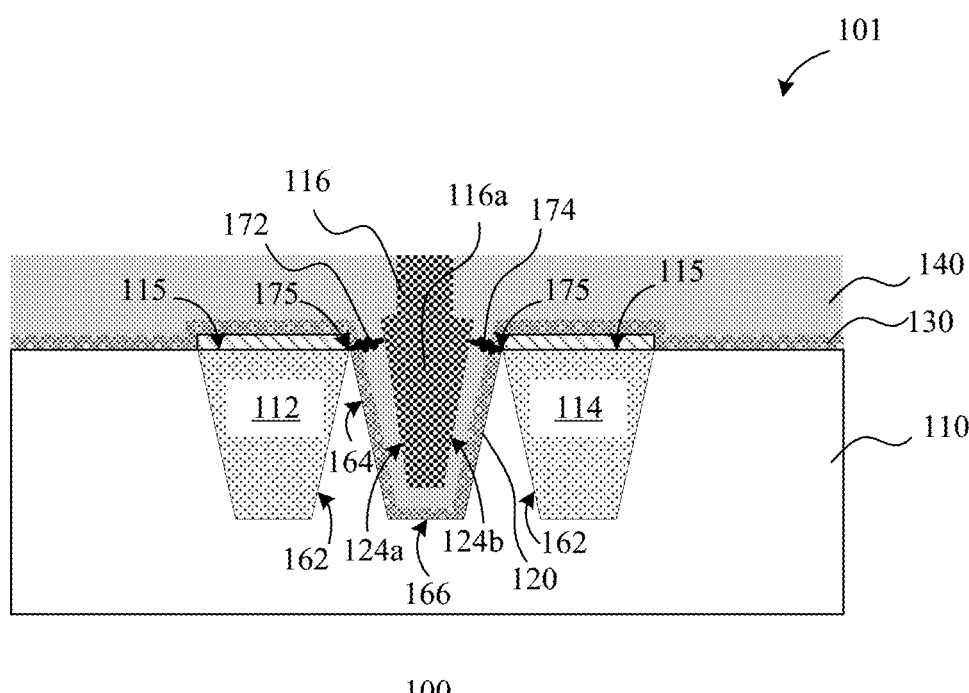
FIG. 2 illustrates a cross-sectional view of an exemplary antifuse structure after programming, according to various embodiments.

The first contact structure 112, the second contact structure 114 and the third contact structure 116 may be connected to separate electrical voltage or current sources that may be programmed as required (not shown). The antifuse structure 101 illustrated in FIG. 1A may be before programming of the antifuse. FIG. 2 illustrates a cross-sectional view of an embodiment of the antifuse structure 101 after programming (e.g., in the programmed state), according to various embodiments.

As illustrated in FIG. 2, the top surface 115 of the first contact structure 112 may adjoin the sidewall 162 of the first contact structure 112 to form an edge 175 of the first contact structure 112 which may be nearest to the first sidewall 124*a* of the first portion 116*a* of the third contact structure 116 in the first opening 120. A permanent conductive link 172 may be formed between the first contact structure 112 and the third contact structure 116 after a sufficiently large programming current is applied to the first contact structure 112 and the third contact structure 116 such that localized charge concentrations are formed at the edge 175 of the first contact structure 112 and the first sidewall 124*a* of the first portion 116*a* of the third contact structure 116. For example, a programming voltage may be applied to one of the first contact structure 112 and the third contact structure 116 while grounding the other. The programming voltage for the antifuse, for example, may be about 1V to 10V. The programming voltage may depend on application. The conductive link 172 may be formed due to, for example, material diffusion or electromigration of atoms or ions of the conductive material in the first contact structure 112 or the third contact structure 116. The conductive link 172 may extend between the edge 175 of the first contact structure 112 and the first sidewall 124*a* of the first portion 116*a* of the third contact structure 116, which may be the shortest distance between the first contact structure 112 and the third contact structure 116. The conductive link 172 may extend through at least the dielectric capping layer 130 in the first opening 120. In the case where the second ILD layer 140 overlaps the dielectric capping layer 130 on the sidewalls 164 of the first opening 120, the conductive link 172 may extend through the dielectric capping layer 130 and the second ILD layer 140 in the first opening 120, as illustrated in FIG. 2. The conductive link 172 forms an electrical connection between the first contact structure 112 and the third contact structure 116. Electrical signals may thereafter pass through the conductive link 172 between the first contact structure 112 and the third contact structure 116.

The top surface 115 of the second contact structure 114 may adjoin the sidewall 162 of the second contact structure 114 to form an edge 175 of the second contact structure 114 which may be nearest to the second sidewall 124*b* of the first portion 116*a* of the third contact structure 116 in the first opening 120. In another embodiment, a conductive link 174 may be formed between the second contact structure 114 and the third contact structure 116 after a sufficiently large programming current is applied to the second contact structure 114 and the third contact structure 116 such that localized charge concentrations are formed at the edge 175 of the second contact structure 114 and the second sidewall 124*b* of the first portion 116*a* of the third contact structure 116. For example, a programming voltage may be applied to one of the second contact structure 114 and the third contact structure 116 while grounding the other. The programming voltage for the antifuse, for example, may be about 1V to 10V. The conductive link 174 may be formed due to, for example, material diffusion or electromigration of atoms or ions of the conductive material in the second contact structure 114 or the third contact structure 116. The conductive link 174 may extend between the edge 175 of the second contact structure 114 and the second sidewall 124*b* of the first portion 116*a* of the third contact structure 116, which may be the shortest distance between the second contact structure 114 and the third contact structure 116. Similarly, the conductive link 174 may extend through at least the dielectric capping layer 130 in the first opening 120. In the case where the second ILD layer 140 overlaps the dielectric capping layer 130 on the sidewalls 164 of the first opening 120, the conductive link 174 may extend through the dielectric capping layer 130 and the second ILD layer 140 in the first opening 120, as illustrated in FIG. 2. The conductive link 174 forms an electrical connection between the second contact structure 114 and the third contact structure 116. Electrical signals may thereafter pass through the conductive link 174 between the second contact structure 114 and the third contact structure 116.

In other embodiments, both the conductive link 172 and the conductive link 174 may be formed by applying a programming current to the first contact structure 112, the second contact structure 114 and the third contact structure 116. For example, the first contact structure 112 and the third contact structure 116 may be biased to have different polarities to form the conductive link 172, and the second contact structure 114 and the third contact structure 116 may be biased to have different polarities to form the conductive link 174. Electrical signals may thereafter pass through the conductive link 172 between the first contact structure 112 and the third contact structure 116 and through the conductive link 174 between the second contact structure 114 and the third contact structure 116.

The length of the conductive link(s) may be configured based on the thickness of the dielectric capping layer 130 and the second ILD layer 140 in the first opening 120. In other words, the length of the conductive link(s) may be controlled by the deposition process of the dielectric capping layer 130 and the second ILD layer 140 in the first opening 120. Accordingly, the antifuse structure 101 is not affected by variations due to overlay of the middle electrode in an upper metal level from the side electrodes located in a level below the middle electrode and/or height variations of the side electrodes resulting from chemical mechanical polishing of the side electrodes, thus advantageously allowing enhanced programming efficiency. Further, the antifuse structure 101 is not constrained by the minimum design rule spacing for metal to metal.

According to various embodiments, the device 100 may advantageously integrate both the antifuse structure in a first region and the air gap between two electrodes in a second region.

FIGS. 3A-3G show cross-sectional views of an exemplary process for forming a device, according to various embodiments. The device, for example, is similar to that described in FIGS. 1A-1B. As such, common elements may not be described or described in detail.

Figure 3A:
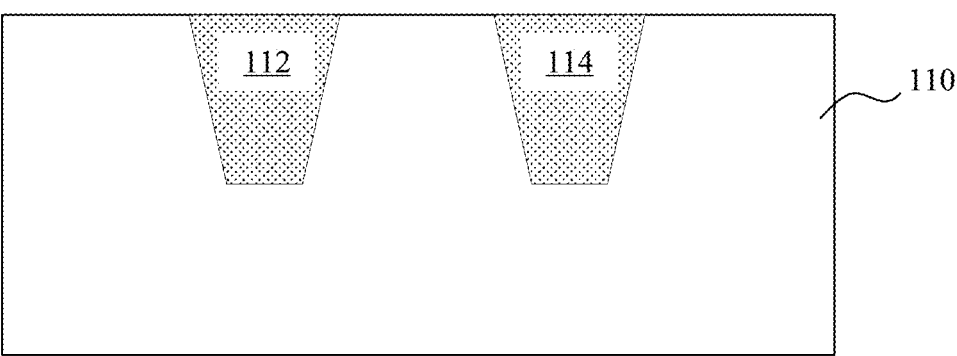
FIGS. 3A-3G show cross-sectional views of a process for forming a device, according to various embodiments.

Referring to FIG. 3A, a first ILD layer 110 is provided. The first ILD layer 110 may be arranged over a substrate (not shown). The first ILD layer 110 may be formed by back-end-of-line (BEOL) processing. In some embodiments, there may be one or more further ILD layers and interconnects arranged between the first ILD layer 110 and the substrate. The first ILD layer 110 may be at the stage of processing where contact structures have been formed in the first ILD layer 110. As illustrated, the first ILD layer 110 includes first and second contact structures 112 and 114 of an antifuse structure to be formed. The first ILD layer 110 may further include contact structures where air gaps may be subsequently formed in between those contact structures (not shown). A top surface of the contact structures (e.g., the first and second contact structures 112 and 114) and the first ILD layer 110 may be substantially coplanar. For example, a planarization step, such as chemical mechanical polishing (CMP) may be performed to provide a substantially planar top surface between the contact structures and the first ILD layer 110.

Figure 3B:
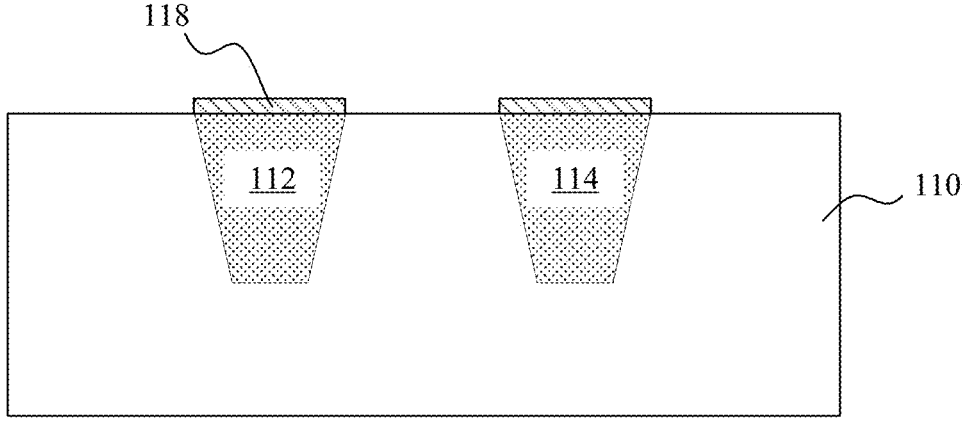

A metallic capping layer 118 may be formed on the contact structures, including on the first contact structure 112 and the second structure 114 as shown in FIG. 3B. The metallic capping layer 118 may be formed by depositing a metal layer over the first ILD layer 110 and the contact structures and patterning the metal layer to form the metallic capping layer 118 on the contact structures.

Figure 3C:
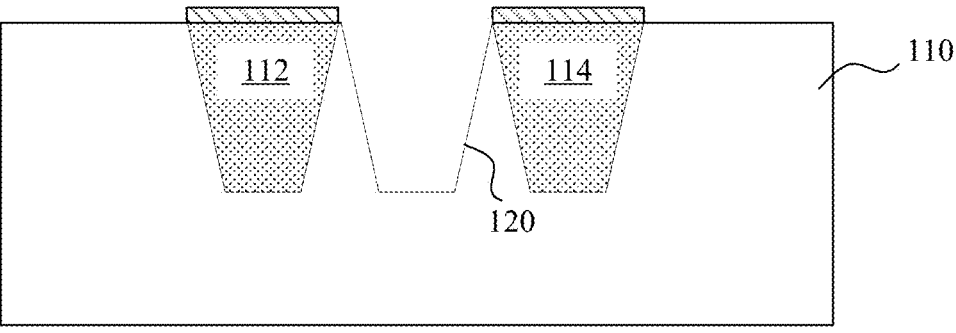

Openings may be formed between the contact structures in the first ILD layer 110. Referring to FIG. 3C, a first opening 120 may be formed between the first contact structure 112 and the second contact structure 114. According to various embodiments, the first opening 120 may be formed between the first contact structure 112 and the second contact structure 114 in a first region of the first ILD layer 110. The first opening 120 in the first region may be used for forming a third contact structure of the antifuse structure. In some embodiments, a second opening may be formed between two contact structures in a second region of the first ILD layer 110 (not shown). The second opening in the second region may be used for forming an air gap. In an embodiment, the first and second openings may be formed simultaneously. The openings may be formed, for example, using the metallic capping layer 118 as an etch mask to remove the dielectric material of the first ILD layer 110 to form the first opening 120 and the second opening (not shown). An etch process such as an anisotropic etch may be used.

Figure 3D:
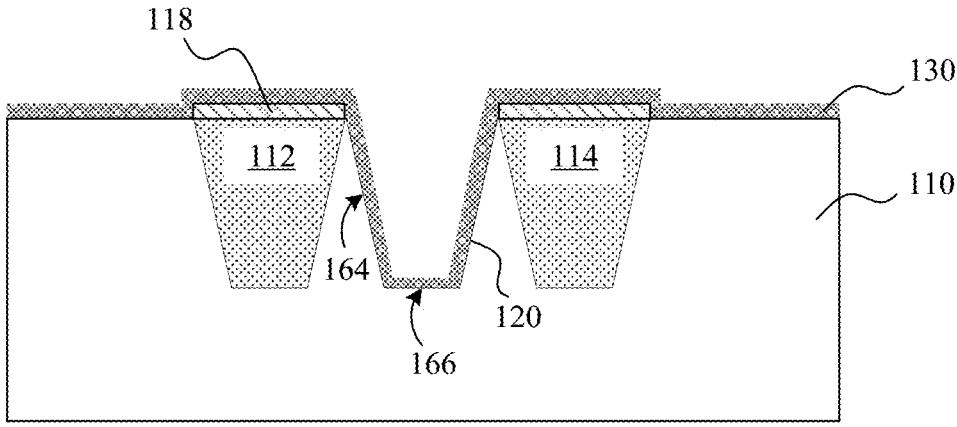

A dielectric capping layer 130 may be formed over the first ILD layer 110 and in the openings between the contact structures. As illustrated in FIG. 3D, the dielectric capping layer 130 may line sidewalls 164 and a bottom surface 166 of the first opening 120. The dielectric capping layer 130 may cover the metallic capping layer 118. The dielectric capping layer 130 may further line sidewalls and a bottom surface of the second opening in the second region (not shown). The dielectric capping layer 130 may be formed, for example, by chemical vapor deposition (CVD).

Figure 3E:
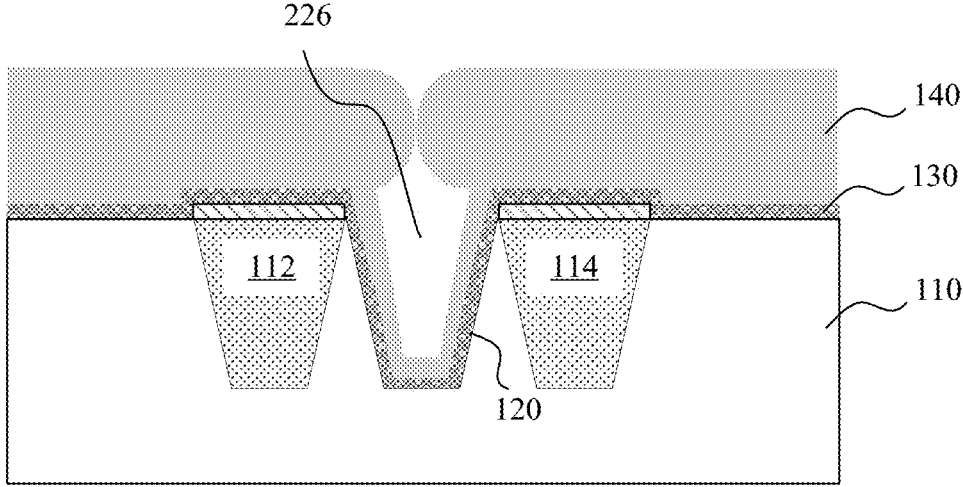

A second ILD layer 140 may be formed over the first ILD layer 110 and in the openings. The second ILD layer 140 may line the dielectric capping layer 130 in the openings. A thickness of the second ILD layer 140 may pinch off above a space separating the contact structures to enclose air gaps between the respective pairs of contact structures. As illustrated in FIG. 3E, the second ILD layer 140 may line the dielectric capping layer 130 in the first opening 120. A thickness of the second ILD layer 140 pinches off above a space separating the first and second contact structures 112 and 114 to completely enclose the air gap 226 in the first opening 120 between the first and second contact structures 112 and 114. A thickness of the second ILD layer 140 may also pinch off above a space separating the two contact structures in the second opening in the second region to completely enclose the air gap in the second opening (not shown).

Figure 3F:
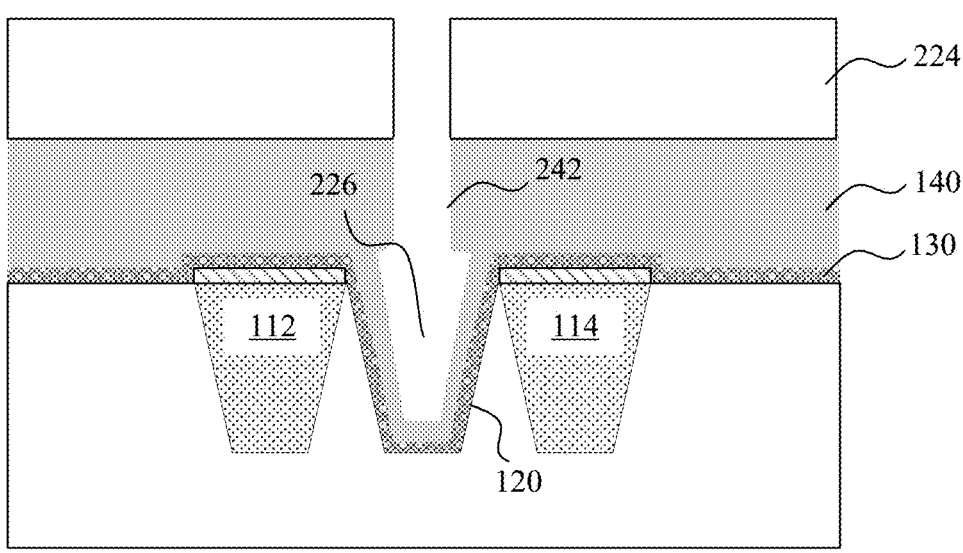

According to various embodiments, the air gap 226 in the first opening 120 where the antifuse structure is to be formed in the first region of the device may be opened. The air gap in the second opening in the second region of the device may remain completely enclosed by the second ILD layer 140. A portion of the second ILD layer 140 may be removed to expose the air gap 226 in the first opening 120 between the first contact structure 112 and the second contact structure 114. The air gap 226 may be opened, for example, by mask and etch techniques. For example, a patterned mask 224 such as a photoresist layer may be formed over the second ILD layer 140 to correspond to a location over the first opening 120 where the air gap 226 is to be opened. For example, a photoresist may be patterned by exposing it with an exposure source using a reticle with the desired pattern. After exposure, the photoresist may be developed, transferring the pattern of the reticle to the photoresist. The patterned photoresist may then be used as an etch mask to remove a portion of the second ILD layer 140 to open the air gap 226. An etch process such as an anisotropic etch (e.g., reactive ion etch) may be used. Referring to FIG. 3F, a via opening 242 may extend through the second ILD layer 140 above the first opening 120 to expose the air gap 226. The air gap 226 between the first contact structure 112 and the second contact structure 114 of the antifuse structure is exposed by the via opening 242. The patterned mask 224 may be removed, for example, by ashing in the case of a photoresist layer, after opening the air gap 226.

Conductive material may be formed in the air gap 226 and the via opening 242 to form the third contact structure 116. The conductive material may be deposited to fill the air gap 226, thus filling the first opening 120 with conductive material. The conductive material may be formed by, for example, plating, such as electro or electro-less plating.

Figure 3G:
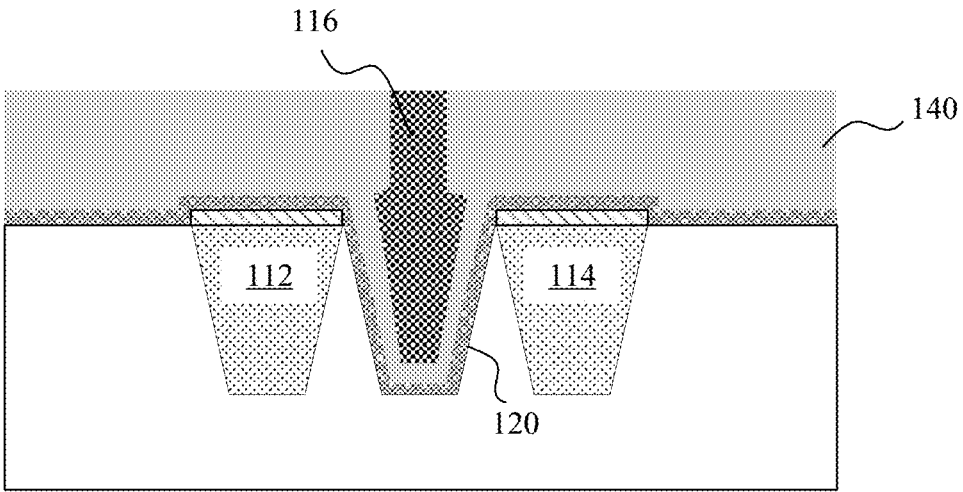

A planarization process, such as chemical mechanical polishing (CMP), may be performed to remove excess conductive material, providing a substantially planar top surface between the third contact structure 116 and the second ILD layer 140 as illustrated in FIG. 3G.

Additional processes may be performed to complete fabrication of the device. Such processes may include forming additional conductive lines or vias, interconnect levels, final passivation, dicing, packaging, testing, etc.

Accordingly, various embodiments provide a method of forming a device including a self-aligned antifuse structure. The antifuse structure may be formed without using an additional mask during the processing of the ILD.

FIGS. 4A-11 illustrate cross-sectional views of devices 300, 400, 500, and 600 according to various embodiments, and in which like reference numerals refer to like features. The devices 300, 400, 500, and 600 may include structures 301, 401, 501 and 601, respectively. The structures 301, 401, 501 and 601 may be arranged over a substrate, such as a semiconductor substrate or a silicon-on-insulator substrate (not shown). In some embodiments, the structures 301, 401, 501 and 601 may be arranged over one or more interlevel dielectric layers (ILDs) in the back-end-of-line (BEOL) layers of a semiconductor device.

Figure 4A:
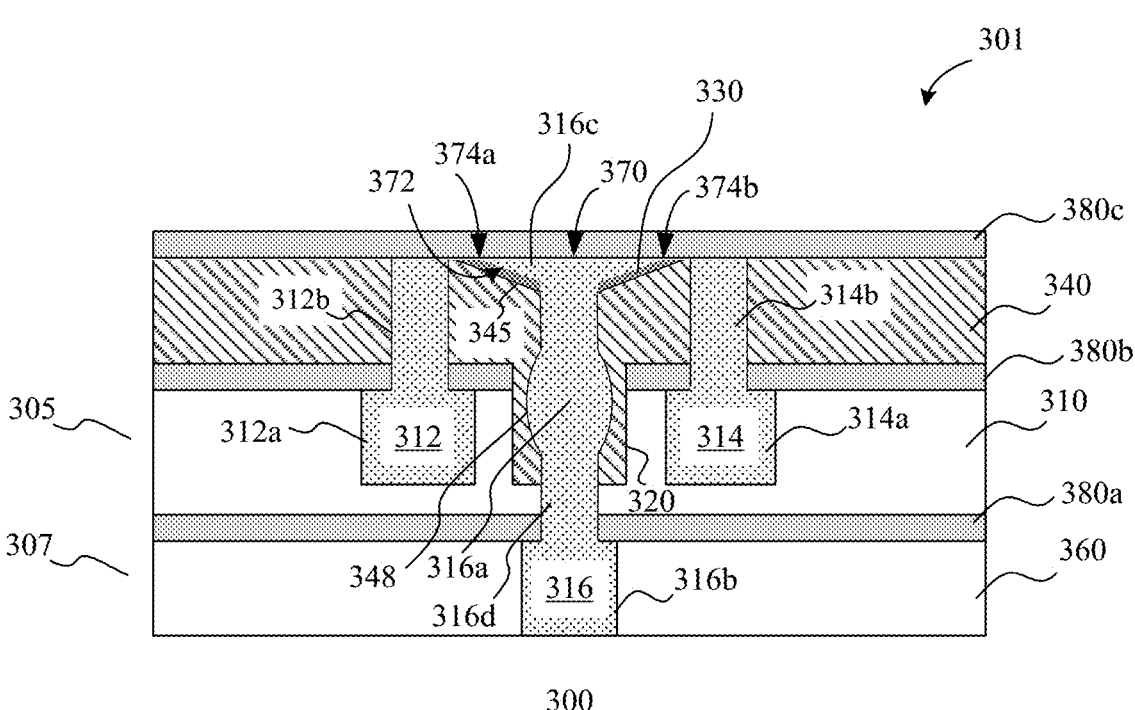
FIGS. 4A-11 illustrate cross-sectional views of various exemplary devices, according to various embodiments.

Referring to FIG. 4A, the structure 301 may include a first contact structure 312, a second contact structure 314 and a third contact structure 316 positioned between the first contact structure 312 and the second contact structure 314. The third contact structure 316 may be a middle electrode positioned between the first contact structure 312 and the second contact structure 314, which may be side electrodes. The first contact structure 312 may include a first metal line 312a and a first via 312b. The second contact structure 314 may include a second metal line 314a and a second via 314b. The first metal line 312a and the second metal line 314a may be in a first ILD layer 310 in a first metallization level 305. In one embodiment, a first opening 320 may be arranged between the first metal line 312a and the second metal line 314a in the first ILD layer 310. A second ILD layer 340 may be arranged over the first metallization level 305 and in the first opening 320. The second ILD layer 340 may line sidewalls and a bottom surface of the first opening 320. The first via 312b and the second via 314b may be in the second ILD layer 340.

In one embodiment, the second ILD layer 340 may include a recess 345. The recess 345 in the second ILD layer 340 may overlap the first opening 320 in the first ILD layer 310. In one embodiment, a dielectric capping layer 330 may line the recess 345. The dielectric capping layer 330 may facilitate planarization control during formation of a terminal electrode portion 316c of the structure 301. The dielectric capping layer 330 may reduce variations due to planarization. The dielectric capping layer 330 may serve as a polish stop layer, for example, to reduce variations due to chemical mechanical polishing. The dielectric capping layer 330 may be formed of a different dielectric material from the second ILD layer 340. The dielectric capping layer 330 and the second ILD layer 340 may be formed of different materials having different etch rates. According to various embodiments, the dielectric capping layer 330 may have a lower etch rate relative to the second ILD layer 340. The dielectric capping layer 330 may be formed of a dielectric material such as a nitride-containing dielectric material. For example, the dielectric capping layer 330 may be formed of silicon nitride. The dielectric capping layer 330, for example, may have a thickness ranging from about 10 nm to about 100 nm. The thickness of the dielectric capping layer 330 may depend on the programing voltage of the antifuse structure, depth of the recess 345 in the second ILD layer 340, and polishing removal rate of the dielectric capping layer 330.

Referring to FIG. 4A, the third contact structure 316 may include a first portion 316a, a third metal line 316b and the terminal electrode portion 316c. The first portion 316a of the third contact structure 316 may be in the first metallization level 305. The first portion 316a of the third contact structure 316 may be laterally arranged between the first metal line 312a and the second metal line 314a. As illustrated in FIG. 4A, the first opening 320 may be partially filled by the second ILD layer 340, with the second ILD layer 340 directly contacting the sidewalls of the first opening 320. The second ILD layer 340 may include an opening 348, which may be completely filled by the first portion 316a such that the first opening 320 does not have an airgap. The opening 348 may be arranged within the second ILD layer 340 in a center portion of the first opening 320, such that the first portion 316a may be spaced from the sidewalls of the first opening 320 by the second ILD layer 340. In one embodiment, the first portion 316a may have curved sidewalls. The third metal line 316b may be arranged in a third ILD layer 360 in a second metallization level 307. In one embodiment, the first metallization level 305 may be $M_x$ and the second metallization level 307 may be $M_{x-1}$, a metallization level below $M_x$. As for the terminal electrode portion 316c, it may be positioned between the first and second vias 312b and 314b in the second ILD layer 340. The terminal electrode portion 316c may partially fill the recess 345. As illustrated in FIG. 4A, the dielectric capping layer 330 lines the recess 345 and the terminal electrode portion 316c may fill a remaining space in the recess 345 in the second ILD layer 340. In one embodiment, the terminal electrode portion 316c may be laterally spaced from the first via 312b and the second via 314b by the dielectric capping layer 330. As shown in FIG. 4A, the terminal electrode portion 316c may be separated from the first via 312b and the second via 314b by dielectric material of the second ILD layer 340 and the dielectric capping layer 330. The third contact structure 316 may further include via 316d connecting the first portion 316a to the third metal line 316b and to the terminal electrode portion 316c.

In one embodiment, a top surface 370 of the terminal electrode portion 316c may be substantially coplanar with top surfaces of the first via 312b and the second via 314b. The top surface 370 of the terminal electrode portion 316c may adjoin sides 372 of the terminal electrode portion 316c to form an edge 374a nearest to the first via 312b and an edge 374b nearest to the second via 314b. The sides 372 may have acute angles with respect to the top surface 370 of the terminal electrode portion 316c. The sides 372 of the terminal electrode portion 316c may be in direct contact with the dielectric capping layer 330. As illustrated in FIG. 4A, the terminal electrode portion 316c may be wider at an upper portion where the top surface 370 is located and taper towards a lower portion in the second ILD layer 340.

The first contact structure 312, the second contact structure 314 and the third contact structure 316 may be formed of a conductive material such as copper, copper alloy, aluminum, tungsten or a combination thereof. Other suitable types of metal, alloys or conductive materials may also be useful. In some embodiments, the first contact structure 312, the second contact structure 314 and the third contact structure 316 may include a conductive barrier layer (not shown) lining sidewalls/sides and a bottom surface of the first contact structure 312, the second contact structure 314 and the third contact structure 316. The conductive barrier layer, for example, may be formed of a conductive barrier material such as tantalum nitride or titanium nitride. In the case the contact structures are formed of copper, dielectric barrier layers 380a, 380b and 380c may be arranged over the top surfaces of the third metal line 316b, first and second metal lines 312a and 314a and first and second vias 312b and 314b and terminal electrode portion 316c, respectively. The dielectric barrier layers 380a, 380b and 380c may prevent out diffusion and oxidation of copper. The dielectric barrier layers 380a, 380b and 380c may be formed of a nitride containing layer such as NBlok. The first ILD layer 310, the second ILD layer 340 and the third ILD layer 360 may be formed of a dielectric material such as, for example, silicon oxide. In some embodiments, the first ILD layer 310 and the third ILD layer 360 may be formed, for example, of hydrogenated silicon oxycarbide (SiCOH). The second ILD layer 340 may be formed of a dielectric material which is denser than the first ILD layer 310, such as silicon dioxide (SiO₂) (e.g., SiO₂ formed using tetraethoxysilane (TEOS) as a precursor or source of Si).

Figure 4B:
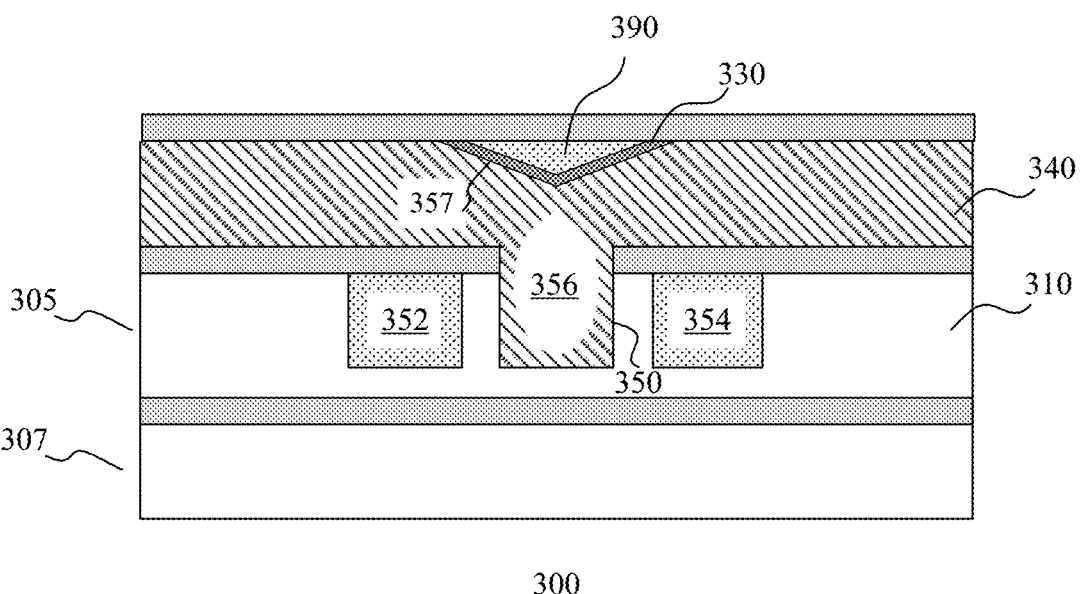

According to various embodiments, the structure 301 may be in a first region of the device 300 and the device 300 may advantageously integrate both the structure 301 in the first region and an air gap between two electrodes in a second region. FIG. 4B illustrates the second region of the device 300. For example, the second region may be adjacent to the first region in which the structure 301 is arranged. The device 300 may further include a second opening 350 arranged between a fourth contact structure 352 and a fifth contact structure 354 in the first ILD layer 310. The second ILD layer 340 may further line sidewalls and a bottom surface of the second opening 350 and enclose an air gap 356 in the second opening 350. For example, a thickness of the second ILD layer 340 pinches off above a space separating the fourth contact structure 352 and the fifth contact structure 354 to enclose the air gap 356. The second ILD layer 340 may include a second recess 357 in the second region. The second recess 357 may overlap the air gap 356. In one embodiment, the dielectric capping layer 330 may line the second recess 357. A conductive material 390 may partially fill the second recess 357 in the second ILD layer 340. As illustrated in FIG. 4B, the dielectric capping layer 330 lines the second recess 357 and the conductive material 390 may fill a remaining space in the second recess 357 in the second ILD layer 340. The conductive material 390, for example, may be copper, copper alloy, aluminum, tungsten or a combination thereof. Other suitable types of metal, alloys or conductive materials may also be useful. In some embodiments, a conductive barrier layer (not shown) may line the dielectric capping layer 330 in the second recess 357. The conductive barrier layer, for example, may be formed of a conductive barrier material such as tantalum nitride or titanium nitride.

Figure 5:
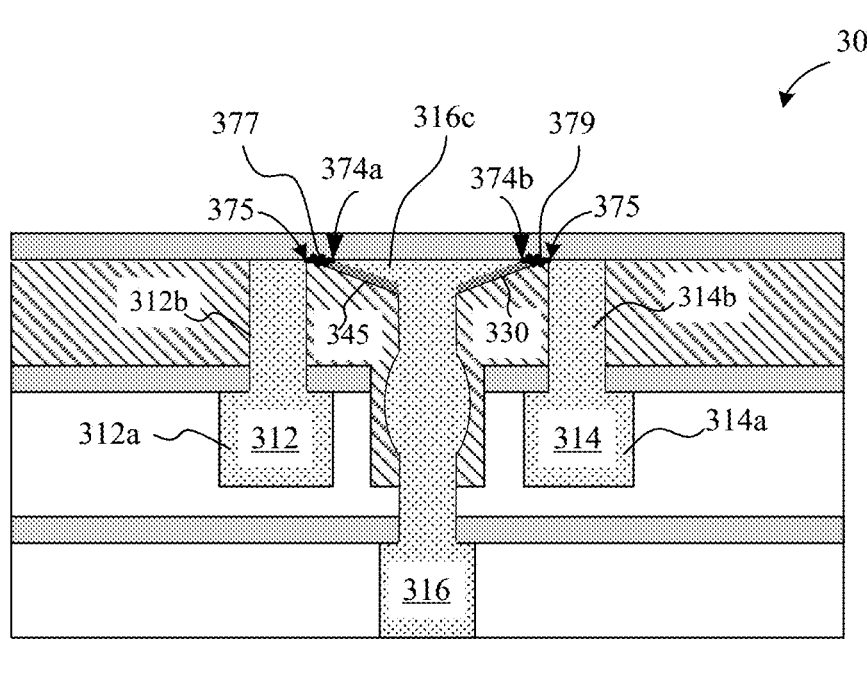

Referring back to FIG. 4A, the first contact structure 312, the second contact structure 314 and the third contact structure 316 may each be connected to separate electrical voltage or current sources that may be programmed as required (not shown). According to one embodiment, the structure 301 may be an antifuse structure. The terminal electrode portion 316c and the first via 312b and/or the second via 314b may form a lateral antifuse. The antifuse structure 301 illustrated in FIG. 4A may be before programming of the antifuse. FIG. 5 illustrates a cross-sectional view of an embodiment of the antifuse structure 101 after programming (e.g., in the programmed state), according to various embodiments.

As illustrated in FIG. 5, a permanent conductive link 377 may be formed between the first via 312b and the terminal electrode portion 316c after a sufficiently large programming current is applied to the first contact structure 312 and the third contact structure 316 such that localized charge concentrations are formed at an edge 375 the first via 312b and the edge 374a of the terminal electrode portion 316c. For example, a programming voltage may be applied to one of the first contact structure 312 and the third contact structure 316 while grounding the other. The programming voltage for the antifuse, for example, may be about 1V to 10V. The programming voltage may depend on application. The conductive link 377 may extend between the edge 375 of the first via 312b and the edge 374a of the terminal electrode portion 316c, which may be the shortest distance between the first contact structure 312 and the third contact structure 316. The conductive link 377 may extend through at least the dielectric capping layer 330 in the recess 345. In another embodiment, a conductive link 379 may be formed between the second via 314b and the terminal electrode portion 316c after a sufficiently large programming current is applied to the second contact structure 314 and the third contact structure 316 such that localized charge concentrations are formed at an edge 375 of the second via 314 and the edge 374b of the terminal electrode portion 316c. For example, a programming voltage may be applied to one of the second contact structure 314 and the third contact structure 316 while grounding the other. The programming voltage for the antifuse, for example, may be about 1V to 10V. The programming voltage may depend on application. In other embodiments, both the conductive link 377 and the conductive link 379 may be formed by applying a programming current to the first contact structure 312, the second contact structure 314 and the third contact structure 316.

Figure 6:
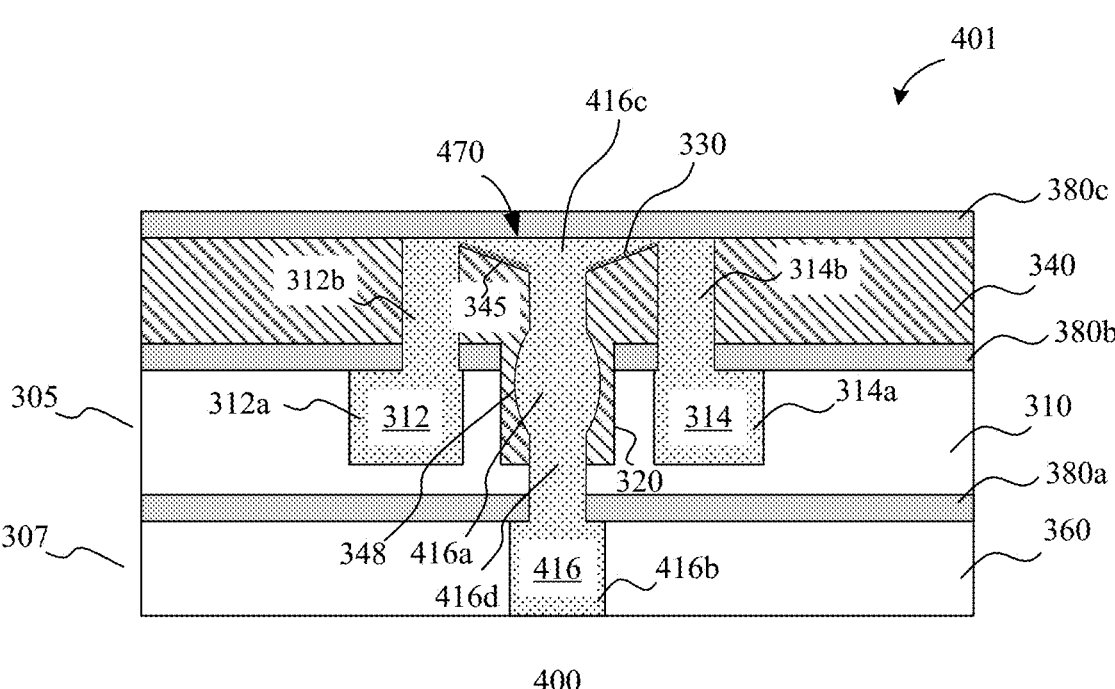

Referring to FIG. 6, the structure 401 of device 400 may be similar to the structure 301 of device 300, but may include a third contact structure 416 having a terminal electrode portion 416c in contact with the first via 312b of the first contact structure 312 and the second via 314b of the second contact structure 314 to form a lateral fuse. The terminal electrode portion 416c may interface the first via 312b and the second via 314b to form conduction paths. Similar to the structure 301 of device 300, the structure 401 may include a dielectric capping layer 330 lining a recess 345 in the second dielectric layer 340. The dielectric capping layer 330 may facilitate planarization control during formation of the terminal electrode portion 416c of the structure 401. The dielectric capping layer 330 may reduce variations due to planarization. The dielectric capping layer 330, for example, may have a thickness ranging from about 10 nm to about 100 nm. The thickness of the dielectric capping layer 330 may depend on the programing voltage of the fuse structure, depth of the recess 345 in the second dielectric layer 340, and polishing removal rate of the dielectric capping layer 330. The terminal electrode portion 416c may partially fill the recess 345 in the second ILD layer 340. As illustrated in FIG. 6, the dielectric capping layer 330 lines the recess 345 and the terminal electrode portion 416c may fill a remaining space in the recess 345 in the second ILD layer 340. A top surface 470 of the terminal electrode portion 416c may be substantially coplanar with top surfaces of the first via 312b and the second via 314b. Referring to FIG. 6, the third contact structure 416 may include a first portion 416a, a third metal line 416b and the terminal electrode portion 416c. The first portion 416a of the third contact structure 416 may be in the first metallization level 305. The second ILD layer 340 may include the opening 348, which may be completely filled by the first portion 416a such that the first opening 320 does not have an airgap. In one embodiment, the first portion 416a may have curved sidewalls. The third metal line 416b may be arranged in a third ILD layer 360 in a second metallization level 307. Similar to the structure 301, the first metallization level 305 may be $M_x$ and the second metallization level 307 may be $M_{x-1}$, a metallization level below $M_x$. The third contact structure 416 may further include via 416d connecting the first portion 416a to the third metal line 416b and to the terminal electrode portion 416c.

According to various embodiments, the structure 401 may be in a first region of the device 400 and the device 400 may advantageously integrate both the structure 401 in the first region and an air gap between two electrodes in a second region, similar to the device 300 in FIG. 4B. For example, a second opening may be arranged between a fourth contact structure and a fifth contact structure in the first ILD layer 310 in the second region (not shown), and the second dielectric layer 340 may line sidewalls and a bottom surface of the second opening and enclose an air gap in the second opening. A thickness of the second ILD layer pinches off above a space separating the fourth contact structure and the fifth contact structure to enclose the air gap.

Figure 7:
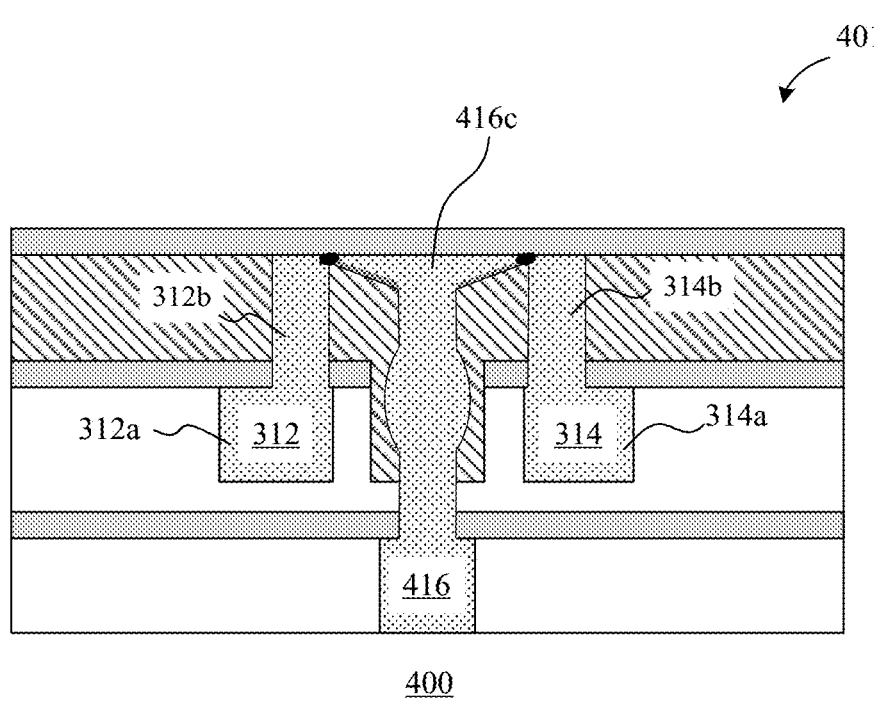

As described, the structure 401 may be a fuse structure. The first contact structure 312, the second contact structure 314 and the third contact structure 416 may each be connected to separate electrical voltage or current sources that may be programmed as required (not shown). The fuse structure may be configured to blow after programming. The programming voltage for the fuse, for example, may be about 1V to 10V. The programming voltage may depend on application. The fuse structure 401 illustrated in FIG. 6 may be before programming of the fuse. FIG. 7 illustrates a cross-sectional view of an embodiment of the fuse structure 401 after programming (e.g., in the programmed state), according to various embodiments. For example, the conduction path(s) between the terminal electrode portion 416c and the via contact 312b and/or the via contact 314b may be broken, as illustrated in FIG. 7.

Figure 8:
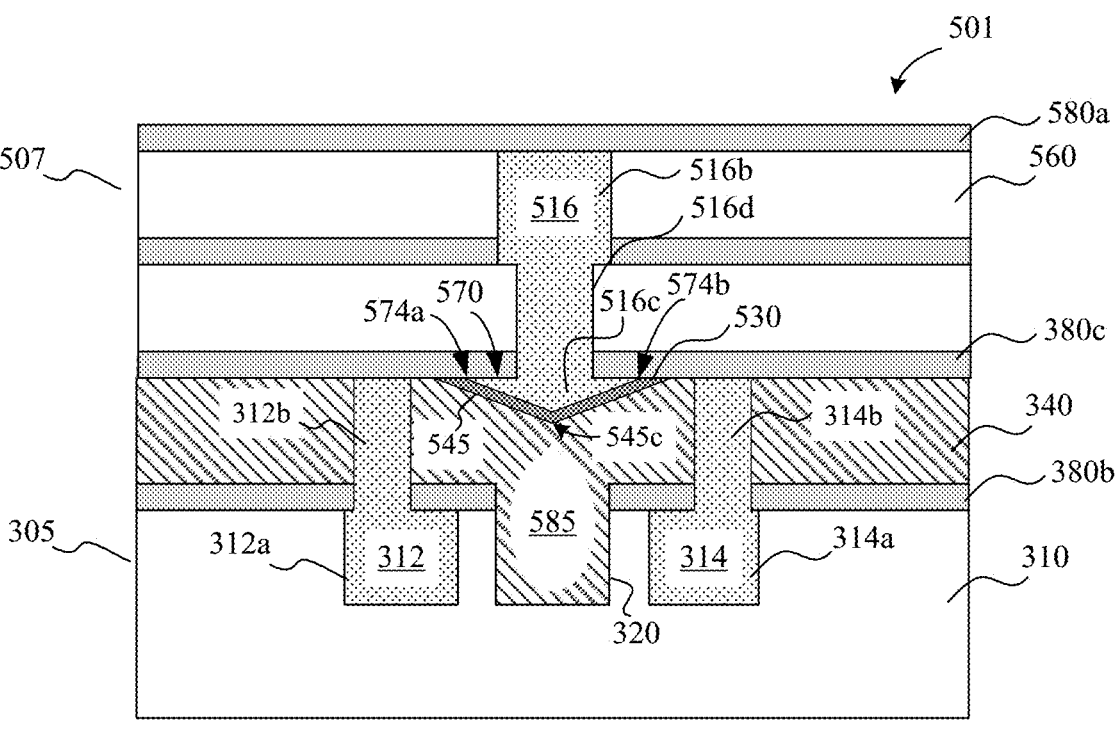

Referring to FIG. 8, the structure 501 of device 500 may be similar to the structure 301 of device 300, but may include an air gap 585 in the first metallization level 305, and a third contact structure 516 having a terminal electrode portion 516c above the air gap 585. The structure 501 may be an antifuse structure. The air gap 585 may be in a first opening 320 arranged between the first metal line 312a and the second metal line 314a in a first ILD layer 310 in the first metallization level 305. A second ILD layer 340 may be arranged over the first metallization level 305 and in the first opening 320. The second ILD layer 340 may line sidewalls and a bottom surface of the first opening 320 and enclose the air gap 585, as illustrated in FIG. 8. The second ILD layer 340 may have a recess 545 above the air gap 585. The recess 545 may have sides which adjoin to form an edge 545c above the air gap 585. A dielectric capping layer 530 may line the sides of the recess 545. The dielectric capping layer 530 may facilitate planarization control during formation of the terminal electrode portion 516c of the structure 501. The dielectric capping layer 530 may reduce variations due to planarization. The dielectric capping layer 530 may serve as a polish stop layer, for example, to reduce variations due to chemical mechanical polishing. The thickness of the dielectric capping layer 530 may depend on the programing voltage of the antifuse structure, depth of the recess 545 in the second dielectric layer 340, and polishing removal rate of the dielectric capping layer 530. Similar to the structure 301 of device 300, the terminal electrode portion 516c of structure 501 may be positioned between the first and second vias 312b and 314b in the second ILD layer 340. The terminal electrode portion 516c may partially fill the recess 545. As illustrated in FIG. 8, the dielectric capping layer 530 lines the recess 545 and the terminal electrode portion 516c may fill a remaining space in the recess 545 in the second ILD layer 340. The terminal electrode portion 516c may be laterally spaced from the first via 312b and the second via 314b by the dielectric capping layer 530. As shown in FIG. 8, the terminal electrode portion 516c may be separated from the first via 312b and the second via 314b by dielectric material of the second ILD layer 340 and the dielectric capping layer 530. In one embodiment, the terminal electrode portion 516c may have a wedge shape.

The third contact structure 516 may further include a third metal line 516b. The third metal line 516b may be arranged in a third ILD layer 560 in a second metallization level 507. In an embodiment, the first metallization level 305 may be $M_x$ and the second metallization level 507 may be $M_{x-1}$, a metallization level above $M_x$. The terminal electrode portion 516c may be connected to the third metal line 516b through via 516d.

A top surface 570 of the terminal electrode portion 516c may be substantially coplanar with top surfaces of the first via 312b and the second via 314b, as illustrated in FIG. 8. The top surface 570 of the terminal electrode portion 516c may adjoin sides of the terminal electrode portion 516c to form an edge 574a nearest to the first via 312b and an edge 574b nearest to the second via 314b. The sides of the terminal electrode portion 516c may have acute angles with respect to the top surface 570 of the terminal electrode portion 516c. The terminal electrode portion 516c may be wider at an upper portion where the top surface 570 is located and taper towards a lower portion in the second ILD layer 340. In the case the contact structures are formed of copper, dielectric barrier layers 580a, 380b and 380c may be arranged over the top surfaces of the third metal line 516b, first and second metal lines 312a and 314a and first and second vias 312b and 314b and terminal electrode portion 516c, respectively.

According to various embodiments, the structure 501 may be in a first region of the device 500 and the device 500 may advantageously integrate both the structure 501 in the first region and a second air gap between two electrodes in a second region, similar to the device 300 in FIG. 4B. For example, a second opening may be arranged between a fourth contact structure and a fifth contact structure in the first ILD layer 310 in the second region (not shown), and the second ILD layer 340 may line sidewalls and a bottom surface of the second opening and enclose the second air gap.

Figure 9:
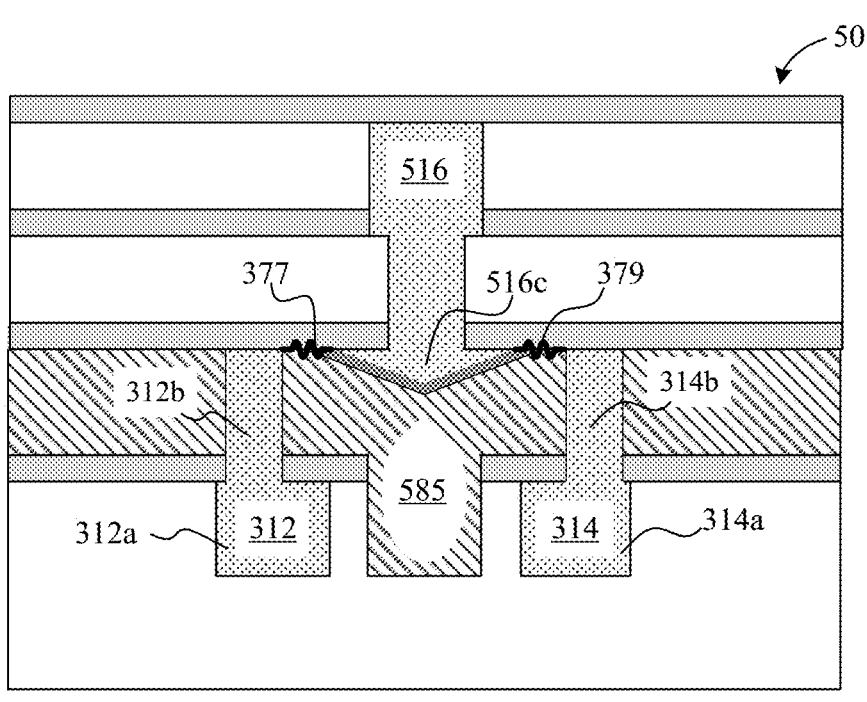

As described, the structure 501 may be an antifuse structure. The terminal electrode portion 516c and the first via 312*b* and/or the second via 314*b* may form a lateral antifuse. The first contact structure 312, the second contact structure 314 and the third contact structure 516 may each be connected to separate electrical voltage or current sources that may be programmed as required (not shown). The antifuse structure 501 illustrated in FIG. 8 may be before programming of the antifuse. FIG. 9 illustrates a cross-sectional view of an embodiment of the antifuse structure 501 after programming (e.g., in the programmed state), according to various embodiments. The programming voltage for the antifuse, for example, may be about 1V to 10V. The programming voltage may depend on application. Similar to the antifuse structure 301, a permanent conductive link 377 may be formed between the first via 312*b* and the terminal electrode portion 516*c* after a sufficiently large programming current is applied to the first contact structure 312 and the third contact structure 516 and/or a conductive link 379 may be formed between the second via 314*b* and the terminal electrode portion 516*c* after a sufficiently large programming current is applied to the second contact structure 314 and the third contact structure 516.

Figure 10:
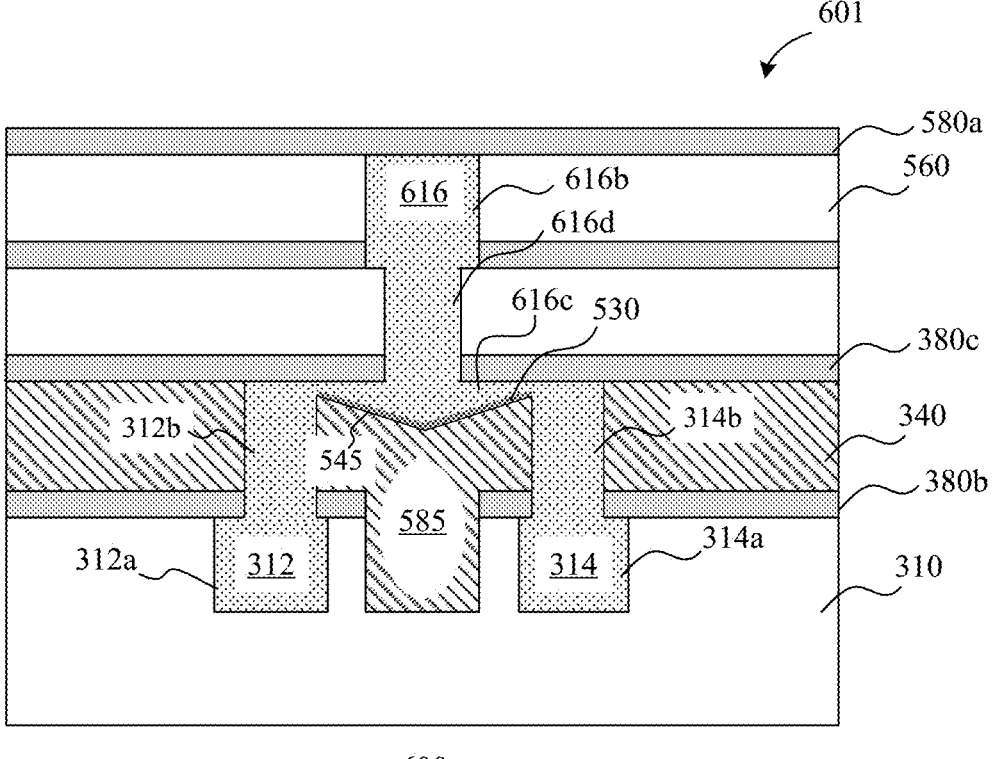

Referring to FIG. 10, the structure 601 of device 600 may be similar to the structure 501 of device 500, but may include a third contact structure 616 having a terminal electrode portion 616*c* in contact with the first via 312*b* of the first contact structure 312 and the second via 314*b* of the second contact structure 314 to form a lateral fuse. The terminal electrode portion 616*c* may interface the first via 312*b* and the second via 314*b* to form conduction paths. Similar to the structure 501 of device 500, the structure 601 may include a dielectric capping layer 530 lining the sides of a recess 545. The dielectric capping layer 530 may facilitate planarization control during formation of the terminal electrode portion 616*c* of the structure 601. The dielectric capping layer 530 may reduce variations due to planarization. The dielectric capping layer 530, for example, may have a thickness ranging from about 10 nm to about 100 nm. The thickness of the dielectric capping layer 530 may depend on the programing voltage of the fuse structure, depth of the recess 545 in the second dielectric layer 340, and polishing removal rate of the dielectric capping layer 530. The terminal electrode portion 616*c* may be connected to a third metal line 616*b* through via 616*d*.

According to various embodiments, the structure 601 may be in a first region of the device 600 and the device 600 may advantageously integrate both the structure 601 in the first region and a second air gap between two electrodes in a second region, similar to the device 500. For example, a second opening may be arranged between a fourth contact structure and a fifth contact structure in the first ILD layer 310 in the second region (not shown), and the second ILD layer 340 may line sidewalls and a bottom surface of the second opening and enclose the air gap in the second opening.

Figure 11:
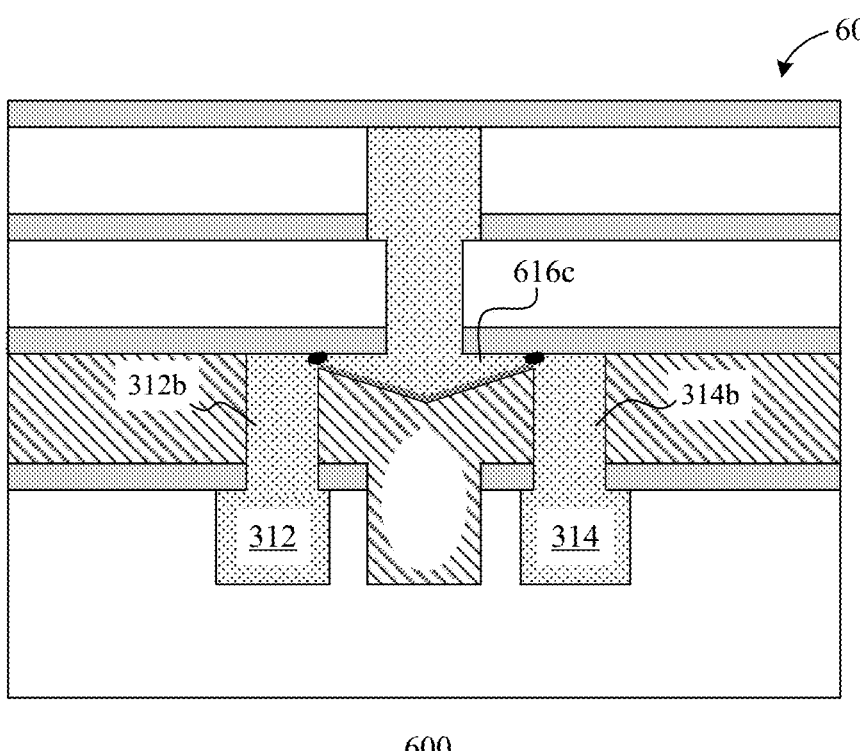

As described, the structure 601 may be a fuse structure. The first contact structure 312, the second contact structure 314 and the third contact structure 616 may each be connected to separate electrical voltage or current sources that may be programmed as required (not shown). The fuse structure may be configured to blow after programming. The programming voltage for the fuse, for example, may be about 1V to 10V. The programming voltage may depend on application. The fuse structure 601 illustrated in FIG. 10 may be before programming of the fuse. FIG. 11 illustrates a cross-sectional view of an embodiment of the fuse structure 601 after programming (e.g., in the programmed state), according to various embodiments. For example, the conduction path(s) between the terminal electrode portion 616*c* and the via contact 312*b* and/or the via contact 314*b* may be broken, as illustrated in FIG. 11.

Figure 12A:
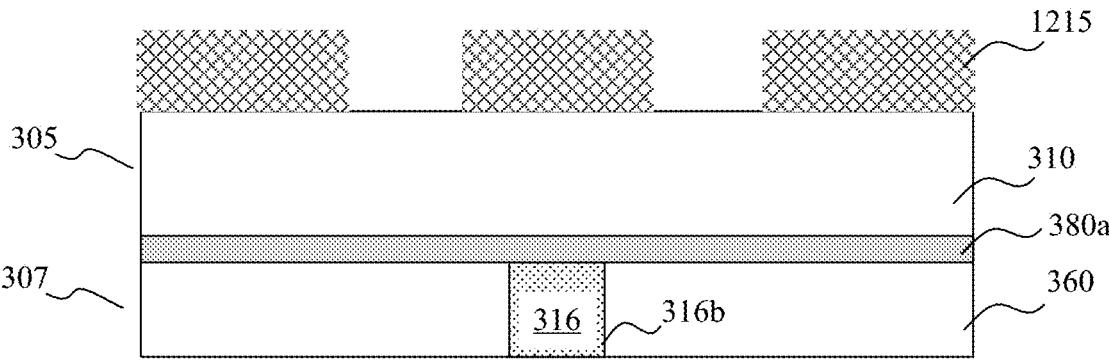
FIGS. 12A-12J show cross-sectional views of another exemplary process for forming a device, according to various embodiments.
Figure 12B:
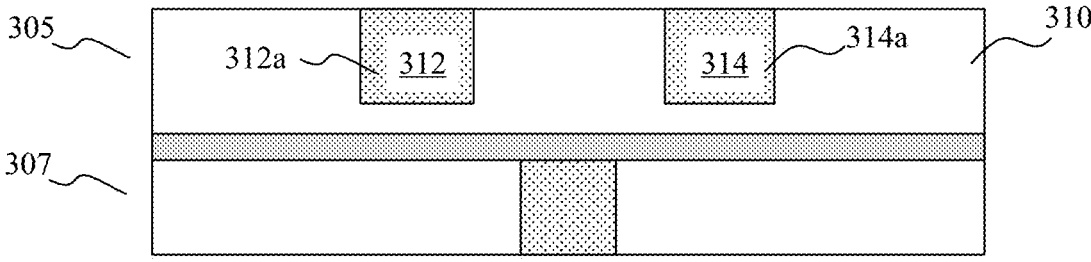

FIGS. 12A-12J show cross-sectional views of an exemplary process for forming the device 300, according to various embodiments. Referring to FIG. 12A, a first ILD layer 310 may be formed over the third metal line 316*b* of the third contact structure 316 and the third ILD layer 360 in the second metallization level 307. In the case the third metal line 316*b* is formed of copper, dielectric barrier layer 380*a* may be formed on the third metal line 316*b* and the third ILD layer 360. A patterned mask 1215, such as a photoresist layer, may be formed over the first ILD layer 310 to correspond to locations where contact structures are to be formed in the first metallization level 305, such as the first metal line 312*a* of the first contact structure 312 and the second metal line 314*a* of the second contact structure 314. The patterned photoresist may be used as an etch mask to remove portions of the first ILD layer 310 to form trenches. An etch process such as an anisotropic etch (e.g., reactive ion etch) may be used. The patterned mask 1215 may be removed, for example, by ashing in the case of a photoresist layer, after forming the trenches. A conductive material may be deposited over the first ILD layer 310 to fill the trenches. The conductive material may be deposited by, for example, plating, such as electro or electro-less plating. Excess conductive material may be removed by a planarization process, such as chemical mechanical polishing, to form the contact structures in the first ILD layer 310, such as the first metal line 312*a* and the second metal line 314*a* in the first region of the device 300, as illustrated in FIG. 12B and the fourth contact structure and the fifth contact structure in the second region (not shown). In the case the conductive material is copper, dielectric barrier layer 380*b* may be formed on the contact structures and the first ILD layer 310 in the first metallization level 305.

Figure 12C:
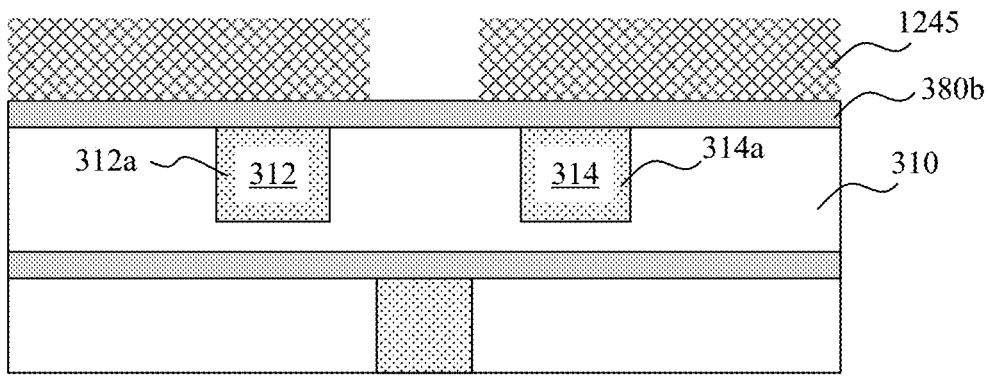
Figure 12D:
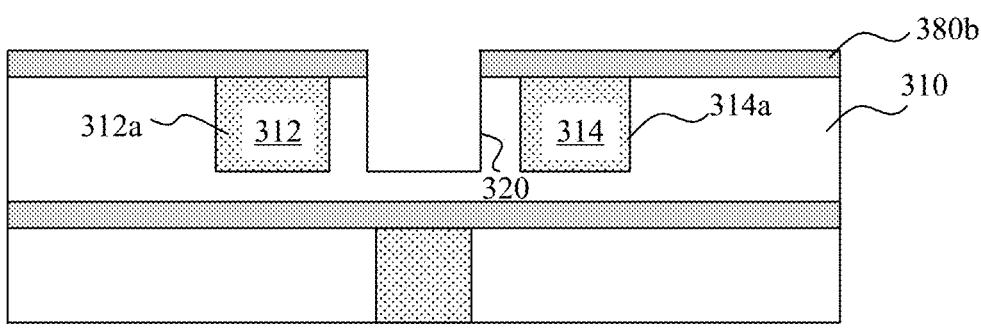

Openings may be formed between the contact structures in the first ILD layer 310. Referring to FIG. 12C, a patterned mask 1245, such as a photoresist layer, may be formed over the first ILD layer 310 to correspond to locations where the openings are to be formed, such as between the first metal line 312*a* and the second metal line 314*a* in the first region and between the fourth contact structure and the fifth contact structure in the second region (not shown). The patterned photoresist may be used as an etch mask to remove portions of the first ILD layer 310 and the dielectric barrier layer 380*b* to form the openings. The openings may be formed in the first and second regions of the device 300 simultaneously. As shown in FIG. 12D, a first opening 320 may be formed between the first metal line 312*a* and the second metal line 314*a* in the first ILD layer 310. An etch process such as an anisotropic etch may be used. The patterned mask 1245 may then be removed.

Figure 12E:
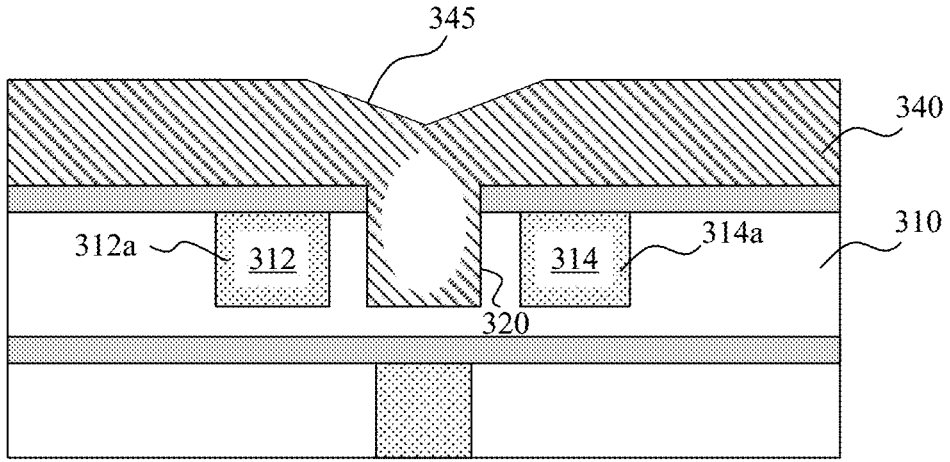
Figure 12F:
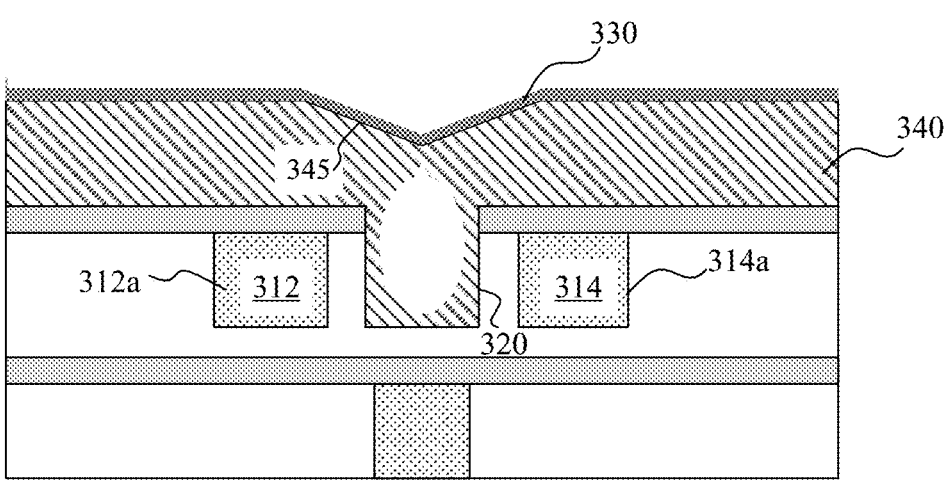

A second ILD layer 340 may be formed over the first ILD layer 310 and in the openings between the contact structures. As illustrated in FIG. 12E, the second ILD layer 340 may line sidewalls and a bottom surface of the first opening 320. The second ILD layer 340 may further line sidewalls and a bottom surface of the second opening in the second region (not shown). The second ILD layer 340 may be formed, for example, by chemical vapor deposition (CVD). A thickness of the second ILD layer 340 may pinch off above a space separating the contact structures to enclose air gaps between the respective pairs of contact structures. The second ILD layer 340 may partially fill the openings between the contact structures to enclose the air gaps. The second ILD layer 340 may have a recess 345 above the air gap in the first opening 320, as shown in FIG. 12E. Referring to FIG. 12F, a dielectric capping layer 330 may be formed over the second ILD layer 340. The dielectric capping layer 330 may cover a top surface of the second ILD layer 340 and line the recess 345. The dielectric capping layer 330 may serve as a polish stop layer.

Figure 12G:
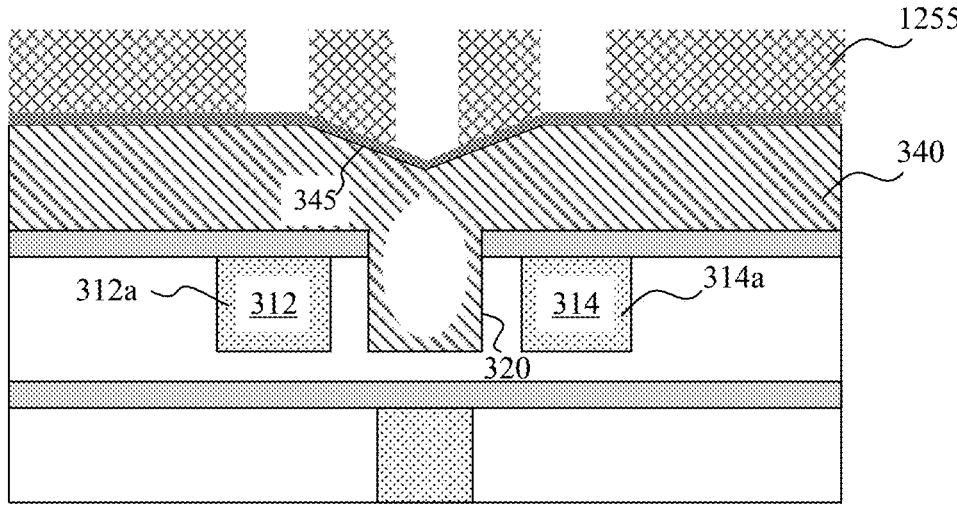

According to various embodiments, the air gaps in the first region may be opened and subsequently filled with conductive material, while the air gaps in the second region of the device 300 may be retained. Referring to FIG. 12G, a patterned mask 1255, such as a photoresist layer, may be formed over the second ILD layer 340 to correspond to locations where the air gaps are to be opened and subsequently filled with the conductive material, such as the air gap between the first metal line 312a and the second metal line 314a in the first region. The patterned mask may further correspond to locations where via openings for vias of the contact structures are to be formed. For example, a photoresist may be patterned by exposing it with an exposure source using a reticle with the desired pattern. After exposure, the photoresist may be developed, transferring the pattern of the reticle to the photoresist. The patterned photoresist may then be used as an etch mask to remove portions of the second ILD layer 340. An etch process such as an anisotropic etch (e.g., reactive ion etch) may be used.

Figure 12H:
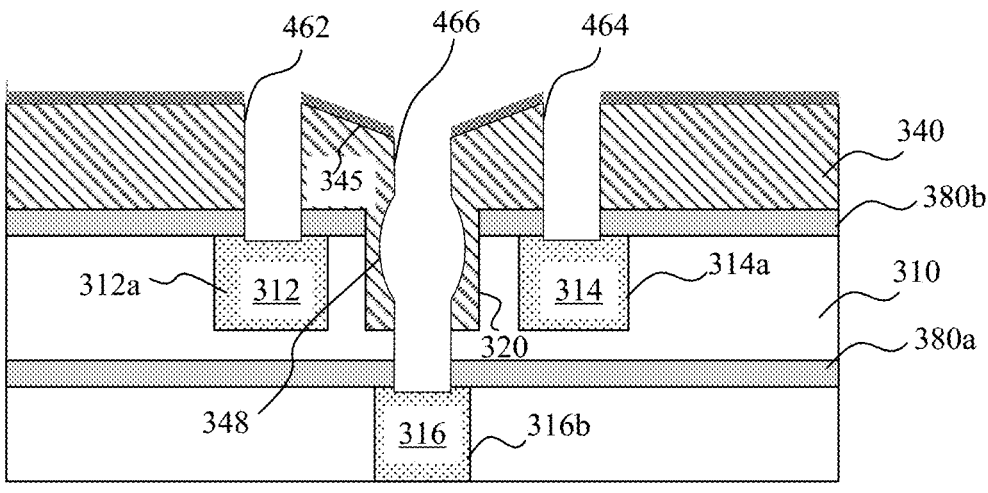

As shown in FIG. 12H, via openings 462, 464, and 466 may be formed through the second ILD layer 340 to expose the first metal line 312a, the second metal line 314a and the third metal line 316b, respectively. The via opening 466 may extend through the second ILD layer 340 to expose the air gap between the first metal line 312a and the second metal line 314a in the first region, and through the first ILD layer 310 to expose the third metal line 316b. In the case where dielectric barrier layers 380a and/or 380b are formed, it is understood that portions of the dielectric barrier layers 380a and/or 380b may also be removed. As shown, the second ILD layer 340 may have an opening 348, which may be subsequently filled by the first portion 316a of the third contact structure 316 such that the first opening 320 does not have an airgap. The air gap in the second region of the device may remain completely enclosed by the second ILD layer 340 (not shown). Accordingly, the patterned mask 1255 may be used to open the air gap(s) in the first region, while retaining the air gap(s) in the second region. The patterned mask 1255 may then be removed after forming the via openings.

Figure 12I:
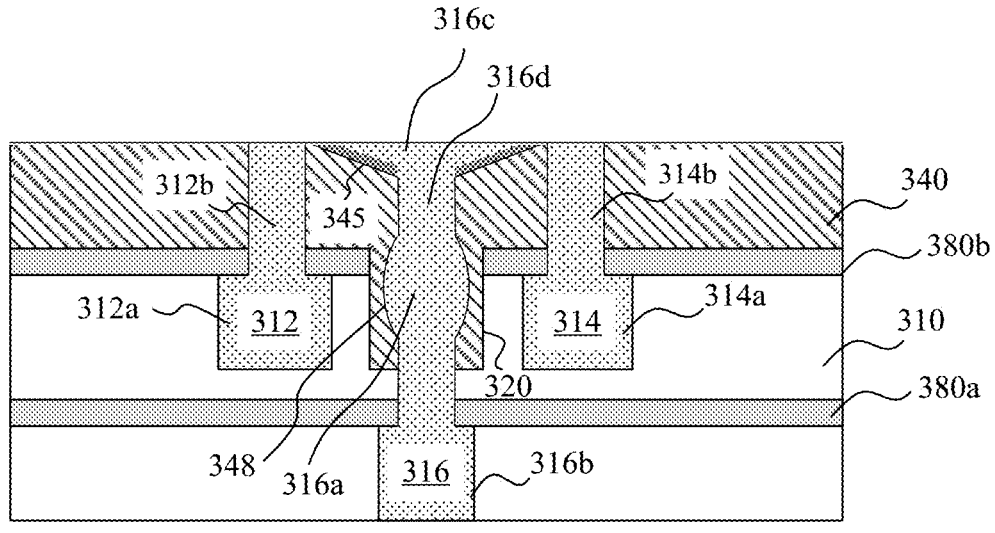

A conductive material may be deposited to fill the opening 348, the via openings 462, 464, and 466 and the recess 345. The conductive material may be formed by, for example, plating, such as electro or electro-less plating. A planarization process, such as chemical mechanical polishing, may be performed to remove excess conductive material. As illustrated in FIG. 12I, the conductive material may fill the opening 348 to form the first portion 316a, the via opening 466 to form the via 316d and the recess 345 to form the terminal electrode portion 316c of the third contact structure 316. The conductive material may also fill the via openings 462 and 464 to form the via 312b of the first contact structure 312 and the via 314b of the second contact structure 314. A top surface of the terminal electrode portion 316c and the second ILD layer 340 may be substantially coplanar. In some embodiments, a distance between the terminal electrode portion 316c and the vias 312b and 314b may be tuned at the planarization process depending on high voltage or low voltage applications.

Figure 12J:
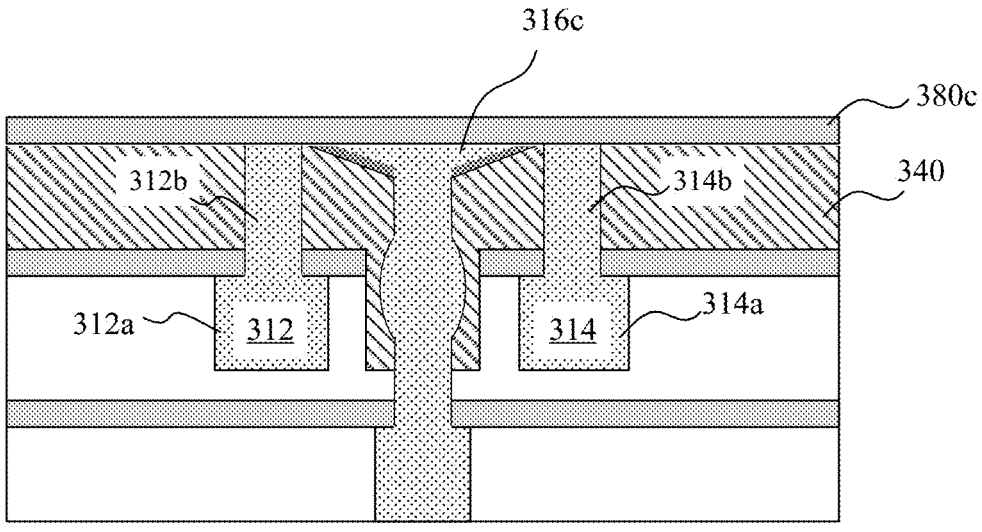

Referring to FIG. 12J, dielectric barrier layer 380c may be formed over vias 312b and 314b, the terminal electrode portion 316c and the second ILD layer 340. Additional processes may be performed to complete fabrication of the device. Such processes may include forming additional conductive lines or vias, interconnect levels, final passivation, dicing, packaging, testing, etc.

The process for forming the device 400 may be similar to the process for forming the device 300 as described with respect to FIGS. 12A-12J, but may include using patterned mask 1255 (see FIG. 12G) having a different pattern. For example, the mask 1255 may be patterned to correspond to locations of via openings 462 and 464 which are to be positioned nearer to the recess 345 such that the subsequently formed via openings coincide with the recess 345.

Figure 13A:
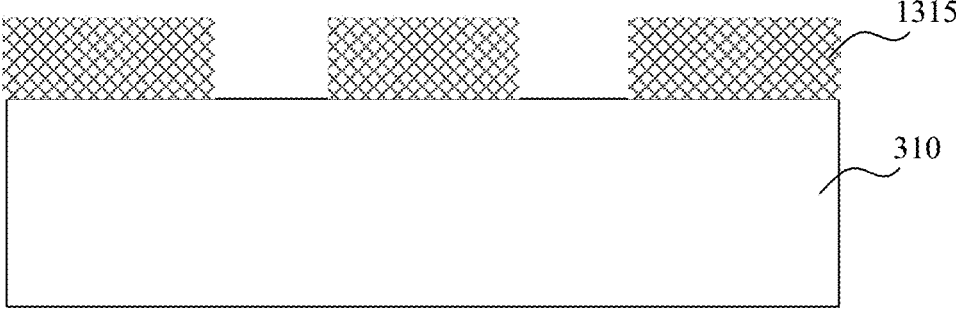
FIGS. 13A-13G show cross-sectional views of yet another exemplary process for forming a device, according to various embodiments.
Figure 13B:
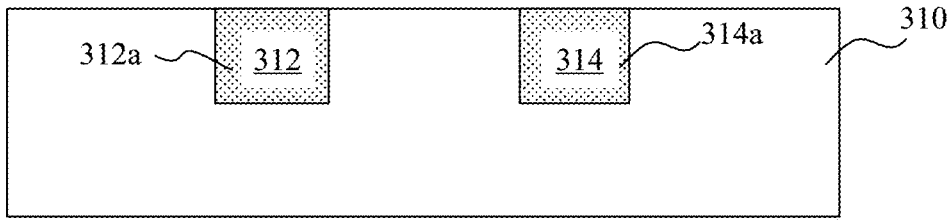

FIGS. 13A-13M show cross-sectional views of an exemplary process for forming the device 500, according to various embodiments. Referring to FIG. 13A, a patterned mask 1315, such as a photoresist layer, may be formed over the first ILD layer 310 to correspond to locations where contact structures are to be formed, such as the first metal line 312a of the first contact structure 312 and the second metal line 314a of the second contact structure 314. The patterned photoresist may be used as an etch mask to remove portions of the first ILD layer 310 to form trenches. An etch process such as an anisotropic etch may be used. The patterned mask 1315 may be removed after forming the trenches. A conductive material may be deposited over the first ILD layer 310 to fill the trenches. Excess conductive material may be removed by a planarization process to form the contact structures in the first ILD layer 310, such as the first metal line 312a and the second metal line 314a in the first region, as illustrated in FIG. 13B and the fourth contact structure and the fifth contact structure in the second region (not shown). In the case the conductive material is copper, dielectric barrier layer 380b may be formed on the contact structures and the first ILD layer 310.

Figure 13C:
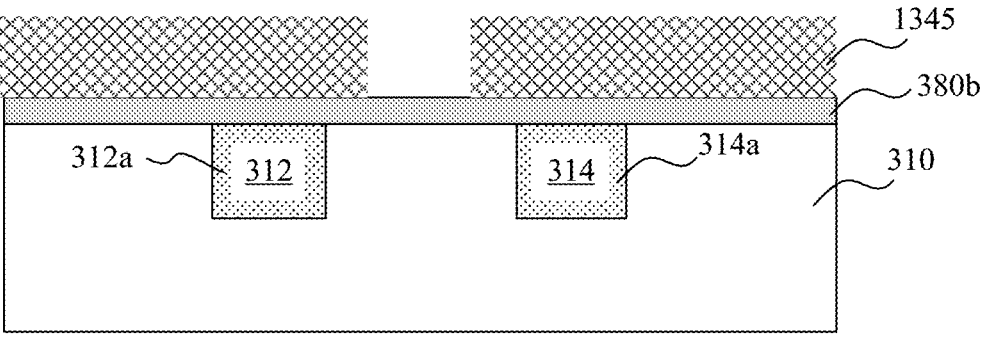
Figure 13D:
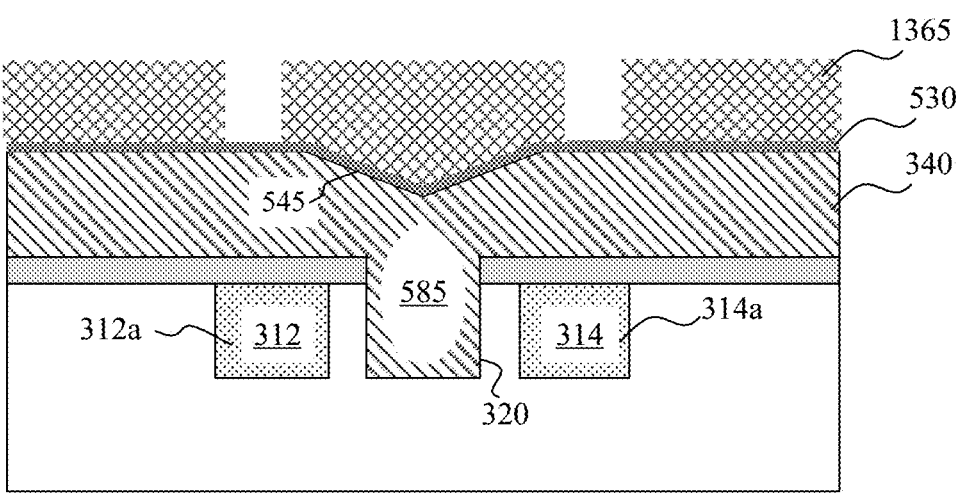
Figure 13E:
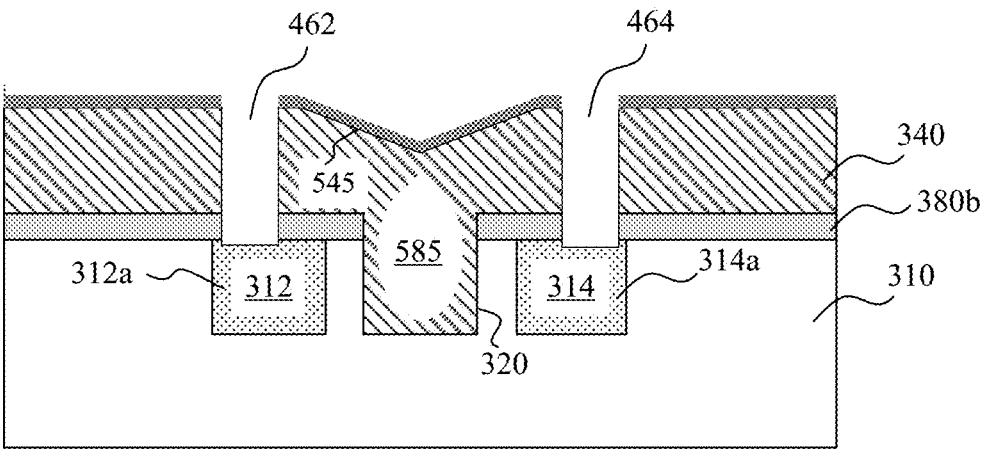

Similar to the process steps illustrated in FIGS. 12C-12F, openings may be formed between the contact structures in the first ILD layer 310. For example, a patterned mask 1345 may be formed over the first ILD layer 310 to correspond to locations where the openings are to be formed, such as between the first metal line 312a and the second metal line 314a as illustrated in FIG. 13C. Referring to FIG. 13D, the first opening 320 may be formed between the first metal line 312a and the second metal line 314a in the first ILD layer 310. The patterned mask 1345 may then be removed. A second ILD layer 340 may be formed over the first ILD layer 310 and in the openings between the contact structures, similar to the process step in FIG. 12E. As illustrated in FIG. 13D, a thickness of the second ILD layer 340 may pinch off above a space separating the first metal line 312a and the second metal line 314a to enclose air gap 585 between the first metal line 312a and the second metal line 314a. The second ILD layer 340 may have a recess 545 above the air gap 585 in first opening 320. A dielectric capping layer 530 may be formed over the second ILD layer 340. The dielectric capping layer 530 may cover a top surface of the second ILD layer 340 and line the recess 545. A patterned mask 1365, such as a photoresist layer, may be formed over the second ILD layer 340 to correspond to locations where via openings for vias of the first and second contact structures 312 and 314 are to be formed. The patterned photoresist may then be used as an etch mask to remove portions of the second ILD layer 340 and the dielectric capping layer 530, while retaining the air gap 585 between the first metal line 312a and the second metal line 314a. As shown in FIG. 13E, via openings 462 and 464 may be formed through the second ILD layer 340 to expose the first metal line 312a and the second metal line 314a. In the case where dielectric barrier layer 380b is formed, it is understood that portions of the dielectric barrier layer 380b may also be removed. The patterned mask 1365 may be removed after forming the via openings 462 and 464.

Figure 13F:
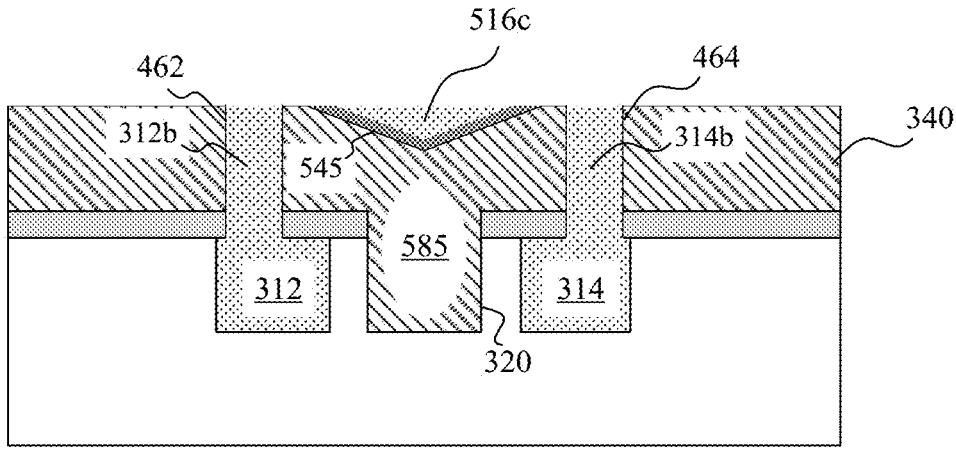

A conductive material may be deposited to fill the via openings 462 and 464, and the recess 545 in the second ILD layer 340. A planarization process, such as chemical mechanical polishing, may be performed to remove excess conductive material. As illustrated in FIG. 13F, the conductive material may fill a space in the recess 545 to form the terminal electrode portion 516c and the via openings 462 and 464 to form the via 312b of the first contact structure 312 and the via 314b of the second contact structure 314. A top surface of the terminal electrode portion 516c and the second ILD layer 340 may be substantially planar.

Figure 13G:
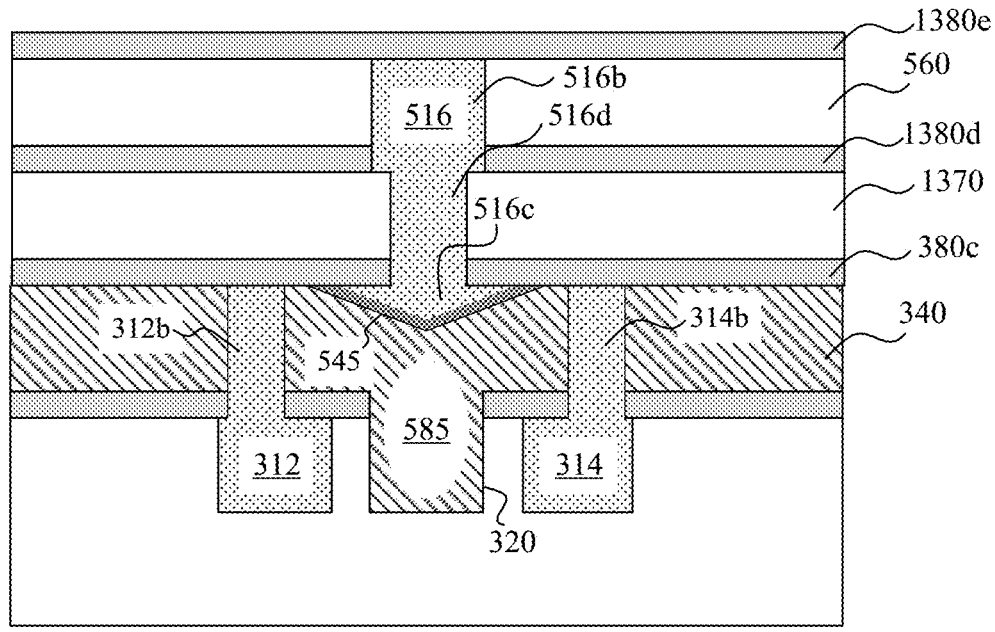

Referring to FIG. 13G, a third metal line 516b of the third contact structure 516 may formed be in a third ILD layer 560. A via 516d may be formed to connect the terminal electrode portion 516c to the third metal line 516b. For example, a dielectric barrier layer 380c may be formed over vias 312b and 314b, the terminal electrode portion 516c and the second ILD layer 340. An intermediate dielectric layer 1370 may be formed over the dielectric barrier layer 380c. A via opening may be formed in the intermediate dielectric layer 1370 and the dielectric barrier layer 380c. The via opening, for example, may be formed by mask and etch techniques. A conductive material may be deposited to fill the via opening and a planarization process may be performed to remove excess conductive material, forming the via 516d. A dielectric barrier layer 1380d may be formed over the via 516d and the intermediate dielectric layer 1370. The third ILD layer 560 may be formed over the dielectric barrier layer 1380d. A trench opening may be formed in the third ILD layer 560 and the dielectric barrier layer 1380d, for example, by mask and etch techniques. A conductive material may be deposited to fill the trench opening and a planarization process may be performed to remove excess conductive material, forming the third metal line 516b. A dielectric barrier layer 1380e may be formed over the third metal line 516b and the third ILD layer 560.

Additional processes may be performed to complete fabrication of the device. Such processes may include forming additional conductive lines or vias, interconnect levels, final passivation, dicing, packaging, testing, etc.

The process for forming the device 600 may be similar to the process for forming the device 500 as described with respect to FIGS. 13A-13G, but may include using patterned mask 1365 (see FIG. 13D) having a different pattern from that used for forming the device 500 as illustrated in FIG. 13D. For example, the mask 1365 may be patterned to correspond to locations of via openings 462 and 464 which are to be formed nearer to the recess 545 such that the subsequently formed via openings coincide with the recess 545.

As described, the air gap(s) in the first region of the devices may be filled with conductive material for forming the terminal electrode portion (e.g., devices 300, 400), while the air gap(s) in a second region may be retained. The filled air gap(s) in the first region may provide better structural integrity for the devices, while the air gap(s) in the second region may reduce capacitance between the contact structures, thus improving device performance. The structures 301, 401, 501 and 601 each having the terminal electrode portion as described may provide antifuse or fuse structures within the back-end-of-line layers. Further, the structures 301, 401, 501 and 601 may provide antifuse or fuse structures with enhanced programming efficiency.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
an antifuse structure including,
a first contact structure and a second contact structure in a first interlevel dielectric (ILD) layer;
an opening arranged between the first contact structure and the second contact structure in the first ILD layer;
a dielectric capping layer lining at least sidewalls of the opening;
a second ILD layer over the first ILD layer and in the opening, wherein the second ILD layer lines the dielectric capping layer on at least the sidewalls of the opening; and
a third contact structure between the first contact structure and the second contact structure, wherein the third contact structure comprises a first portion in the opening.

2. The device of claim 1, wherein the dielectric capping layer and the second ILD layer are formed of different materials having different etch rates.

3. The device of claim 2, wherein the dielectric capping layer comprises silicon nitride.

4. The device of claim 1, wherein the third contact structure further comprises a second portion above the first portion, the second portion having a width less than an upper section width of the first portion.

5. The device of claim 1, wherein a portion of the first ILD layer fills a space between immediately adjacent sidewalls of the first contact structure and the opening.

6. The device of claim 5, wherein the immediately adjacent sidewalls of the first contact structure and the opening are spaced from each other at a first end and converge at an opposing second end.

7. The device of claim 1, further comprising a stacked interlayer dielectric portion between the first contact structure and the third contact structure, the stacked interlayer dielectric portion is an oxide-nitride-oxide stack.

8. The device of claim 1, further comprising a second opening arranged between a third contact structure and a fourth contact structure in the first ILD layer, wherein the dielectric capping layer further lines sidewalls and a bottom surface of the second opening, and the second ILD layer further lines the dielectric capping layer in the second opening and encloses an air gap in the second opening.

9. The device of claim 1, wherein the first portion of the third contact structure has a top surface which is higher than a top surface of the first contact structure.

10. The device of claim 1, further comprising a metallic capping layer on the first contact structure and the second contact structure, wherein the dielectric capping layer is arranged over the metallic capping layer.

11. The device of claim 1, further comprising a conductive link between the first contact structure and the first portion of the third contact structure, wherein the conductive link extends through the dielectric capping layer and the second ILD layer in the opening.

12. The device of claim 11, further comprising a second conductive link between the second contact structure and the first portion of the third contact structure, wherein the second conductive link extends through the dielectric capping layer and the second ILD layer in the opening.

13. A device comprising:

an antifuse structure including, a first contact structure and a second contact structure in a first interlevel dielectric (ILD) layer;

an opening arranged between the first contact structure and the second contact structure in the first ILD layer;

a dielectric capping layer lining at least sidewalls of the opening;

a third contact structure between the first contact structure and the second contact structure, wherein the third contact structure comprises a first portion in the opening; and a conductive link extending between the first contact structure and the third contact structure and through the dielectric capping layer in the opening.

14. The device of claim 13, wherein the conductive link extends between an edge of the first contact structure and a sidewall of the first portion of the third contact structure.

15. The device of claim 13, further comprising a second ILD layer over the first ILD layer and in the opening, wherein the second ILD layer lines the dielectric capping layer on at least the sidewalls of the opening.

16. The device of claim 15, wherein the dielectric capping layer and the second ILD layer are formed of different materials having different etch rates.

17. The device of claim 15, further comprising a second opening arranged between a third contact structure and a fourth contact structure in the first ILD layer, wherein the dielectric capping layer further lines sidewalls and a bottom surface of the second opening, and the second ILD layer further lines the dielectric capping layer in the second opening and encloses an air gap in the second opening.

18. A method of forming a device, comprising:

providing a first contact structure and a second contact structure in a first interlevel dielectric (ILD) layer;

forming an antifuse structure, wherein forming the antifuse structure includes forming an opening between the first contact structure and the second contact structure in the first ILD layer;

forming a dielectric capping layer to line at least sidewalls of the opening;

forming a second ILD layer over the first ILD layer and in the opening to line the dielectric capping layer on at least the sidewalls of the opening; and forming a third contact structure between the first contact structure and the second contact structure, wherein the third contact structure comprises a first portion in the opening.

19. The method of claim 18, further comprising:

providing a third contact structure and a fourth contact structure in the first ILD layer; and forming a second opening between the third contact structure and the fourth contact structure in the first ILD layer, wherein forming the dielectric capping layer further comprises lining at least sidewalls and a bottom surface of the second opening; and forming the second ILD layer over the first ILD layer further comprises lining the dielectric capping layer in the second opening and enclosing air gaps in the opening and the second opening.

20. The method of claim 19, wherein forming the third contact structure between the first contact structure and the second contact structure comprises removing a portion of the second ILD layer to expose the air gap in the opening between the first contact structure and the second contact structure and depositing a conductive material to fill the air gap.

* * * * *